US009536799B2

(12) United States Patent
Yoshida et al.

(10) Patent No.: US 9,536,799 B2
(45) Date of Patent: Jan. 3, 2017

(54) HOT-MELT TYPE CURABLE SILICONE COMPOSITION FOR COMPRESSION MOLDING OR LAMINATING

(71) Applicants: Dow Corning Corporation, Midland, MI (US); Dow Corning Toray Co., Ltd., Tokyo (JP)

(72) Inventors: Shin Yoshida, Chiba (JP); Makoto Yoshitake, Chiba (JP); Haruna Yamazaki, Chiba (JP); Masaaki Amako, Chiba (JP); Steven Swier, Midland, MI (US); Toshiki Nakata, Chiba (JP)

(73) Assignees: Dow Corning Corporation, Midland, MI (US); Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 14/654,084

(22) PCT Filed: Dec. 20, 2013

(86) PCT No.: PCT/US2013/077074
§ 371 (c)(1),
(2) Date: Jun. 19, 2015

(87) PCT Pub. No.: WO2014/100656
PCT Pub. Date: Jun. 26, 2014

(65) Prior Publication Data
US 2015/0315427 A1    Nov. 5, 2015

Related U.S. Application Data

(60) Provisional application No. 61/740,765, filed on Dec. 21, 2012.

(51) Int. Cl.
| | |
|---|---|
| H01L 23/29 | (2006.01) |
| B32B 9/04 | (2006.01) |
| H01L 21/56 | (2006.01) |
| C08K 3/34 | (2006.01) |
| C08K 3/36 | (2006.01) |
| C08K 3/22 | (2006.01) |
| B32B 27/28 | (2006.01) |
| B32B 27/08 | (2006.01) |
| B32B 7/02 | (2006.01) |
| C09D 183/10 | (2006.01) |
| C08G 77/50 | (2006.01) |
| C09J 183/10 | (2006.01) |

(Continued)

(52) U.S. Cl.
CPC ............ *H01L 23/296* (2013.01); *B32B 7/02* (2013.01); *B32B 27/08* (2013.01); *B32B 27/283* (2013.01); *C08G 77/50* (2013.01); *C08K 3/22* (2013.01); *C08K 3/34* (2013.01); *C08K 3/36* (2013.01); *C09D 183/10* (2013.01); *C09J 183/10* (2013.01); *H01L 21/56* (2013.01); *H01L 33/56* (2013.01); *B32B 3/30* (2013.01); *B32B 2250/24* (2013.01); *B32B 2264/104* (2013.01); *B32B 2307/418* (2013.01); *B32B 2307/536* (2013.01); *B32B 2457/14* (2013.01); *C08K 2003/2241* (2013.01); *C08K 2201/00* (2013.01); *H01L 24/73* (2013.01); *H01L 24/97* (2013.01); *H01L 33/502* (2013.01); *H01L 2224/32225* (2013.01); *H01L 2224/48227* (2013.01); *H01L 2224/73265* (2013.01); *H01L 2224/97* (2013.01); *H01L 2924/12041* (2013.01); *H01L 2924/181* (2013.01); *Y10T 428/24612* (2015.01); *Y10T 428/24942* (2015.01); *Y10T 428/24983* (2015.01); *Y10T 428/31663* (2015.04)

(58) Field of Classification Search
None
See application file for complete search history.

(56) References Cited

U.S. PATENT DOCUMENTS 7,847,302 B2 * 12/2010 Basin ...................... H01L 24/97
257/100
7,858,198 B2 * 12/2010 Kashiwagi .............. C08L 83/04
427/387

(Continued)

FOREIGN PATENT DOCUMENTS

| CN | 101521532 A | 9/2009 |
| CN | 101548391 A | 9/2009 |

(Continued)

OTHER PUBLICATIONS

"International Application Serial No. PCT/US2013/077074, International Search Report mailed May 26, 2014", 4 pgs.
"International Application Serial No. PCT/US2013/077074, Written Opinion mailed May 26, 2014", 7 pgs.
"Chinese Application Serial No. 201380066857.7, Office Action mailed May 25, 2016", W/ English Translation, 25 pgs.
"European Application Serial No. 13821344.2, Communication pursuant to Rules 161(1) and 162 EPC mailed Jul. 28, 2015", 2 pgs.
"European Application Serial No. 13821344.2, Response filed Feb. 8, 2016 to Communication pursuant to Rules 161(1) and 162 EPC mailed Jul. 28, 2015", 11 pgs.

(Continued)

*Primary Examiner* — Marc Zimmer
(74) *Attorney, Agent, or Firm* — Schwegman Lundberg & Woessner, P.A.

(57) ABSTRACT

The present invention relates to a hot-meltable curable silicone composition for compression molding or laminating and a laminate provided with at least one layer comprising the composition, as well as a semiconductor device using these and a method of manufacturing the same. In accordance with the present invention, it is possible to efficiently manufacture a semiconductor device provided with a hemispheroidal lens- or dome-shaped seal. In the present invention, it is easy to control the shape of the seal, and the seal does not contain any bubbles. In the present invention, it is also easy to control the thickness of the coating layer of the semiconductor device apart from the seal.

10 Claims, 7 Drawing Sheets

(51) Int. Cl.
*H01L 33/56* (2010.01)
*B32B 3/30* (2006.01)
*H01L 33/50* (2010.01)
*H01L 23/00* (2006.01)

(56) References Cited

U.S. PATENT DOCUMENTS

| | | | |
|---|---|---|---|
| 2006/0142472 A1 | 6/2006 | Hirai et al. | |
| 2008/0276983 A1* | 11/2008 | Drake | C08L 83/14 136/251 |
| 2010/0273011 A1* | 10/2010 | Zhong | B32B 7/12 428/429 |
| 2013/0105997 A1* | 5/2013 | Matsuda | C09D 183/04 257/791 |
| 2013/0183776 A1* | 7/2013 | Kashiwagi | C08L 83/04 438/26 |
| 2013/0200534 A1* | 8/2013 | Shiobara | H01L 21/78 257/787 |

FOREIGN PATENT DOCUMENTS

| | | |
|---|---|---|
| CN | 102532552 A | 7/2012 |
| CN | 104870585 A | 8/2015 |
| DE | 102006048216 A1 | 4/2008 |
| EP | 2535377 A1 | 12/2009 |
| EP | 2450393 A1 | 5/2012 |
| EP | 2586831 A1 | 5/2013 |
| WO | WO-2007/120197 A2 | 10/2007 |
| WO | WO-2012040457 A1 | 3/2012 |
| WO | WO-2012173167 A1 | 12/2012 |
| WO | WO-2013/138089 A1 | 9/2013 |
| WO | WO-2013/142252 A1 | 9/2013 |
| WO | WO-2013/162051 A1 | 10/2013 |
| WO | WO-2014/100656 A1 | 6/2014 |

OTHER PUBLICATIONS

"International Application Serial No. PCT/US2013/077074, International Preliminary Report on Patentability mailed Jul. 2, 2015", 9 pgs.

* cited by examiner

HOT-MELT TYPE CURABLE SILICONE COMPOSITION FOR COMPRESSION MOLDING OR LAMINATING

CLAIM OF PRIORITY

This application is a U.S. national stage application filed under 35 U.S.C. §371 from International Application Serial No. PCT/US2013/077074, which was filed 20 Dec. 2013, and published as WO2014/100656 on 26 Jun. 2014, and which claims the benefit of priority to U.S. Provisional Patent Application Ser. No. 61/740,765, filed Dec. 21, 2012, which applications and publication are incorporated by reference as if reproduced herein and made a part hereof in their entirety, and the benefit of priority of each of which is claimed herein.

TECHNICAL FIELD

The present invention relates to a hot-meltable curable silicone composition for compression molding or laminating and a laminate provided with at least one layer comprising the composition, as well as a semiconductor device using these and a method of manufacturing the same.

BACKGROUND

Examples of molding methods used to seal semiconductor elements include transfer molding and compression molding. Transfer molding has problems of sealing resin-induced wire displacement, wire deformation, filling defects, and the like. Meanwhile, compression molding has problems that, when a liquid sealing resin flows into a mold, the sealing resin involves bubbles. In addition, since the thickness of the coating layer of the semiconductor element varies according to the amount of liquid sealing resin flowing into the mold, control of the balance between precise control of the amount of resin flowing in and the viscosity of the sealing resin is required. However, it is hard to control the valance.

Then, Japanese Unexamined Patent Application Publication No. 2011-258634A discloses using a laminated photo-semiconductor sealing sheet provided with a sealing resin layer and a phosphor-containing layer to obtain a sealed piece via compression molding. However, the sealing resin layer and the phosphor-containing layer are each obtained by drying a solution obtained by dissolving a silicone elastomer and a modified silicone resin in an organic solvent, and do not involve a hot-meltable hydrosilylation reaction-crosslinkable silicone composition. Thus, it is difficult to control the shape of the seal.

Japanese Unexamined Patent Application Publication No. 2007-123915A discloses laminating an LED using a phosphor sheet of phosphor-containing silicone, but a hot-meltable hydrosilylation reaction-crosslinkable silicone composition is not used, and it is difficult to obtain a hemi-spheroidal lens- or dome-shaped seal.

SUMMARY

The present invention was contrived in view of the abovementioned problems in the prior art. An object of the invention is to provide a method whereby a semiconductor device provided with a hemi-spheroidal lens- or dome-shaped seal can be efficiently manufactured, seal shape can be easily controlled, bubbles in the seal can be avoided, and the thickness of the coating layer of the semiconductor device apart from the seal can be easily controlled.

As the result of dedicated research into achieving the object described above, the inventors discovered that using a hot-meltable curable silicone composition in compression molding or laminating allows a hemi-spheroidal lens- or dome-shaped seal to be efficiently manufactured, the shape of the seal to be easily controlled, bubbles in the seal to be avoided, and the thickness of the coating layer of the semiconductor device apart from the seal to be easily controlled, thereby arriving at the present invention. The inventors also discovered that forming the composition of the present invention into a layer and processing via compression molding or laminating allows a semiconductor device comprising a seal having a laminated structure to be efficiently manufactured. Specifically, the object of the present invention is achieved via a hot-melt type curable silicone composition for compression molding or laminating.

The hot-melt type curable silicone composition for compression molding or laminating according to the present invention is preferably in the form of a film or a sheet.

The hot-melt type curable silicone composition for compression molding or laminating according to the present invention is preferably for use in sealing a semiconductor device.

The hot-melt type curable silicone composition for compression molding or laminating according to the present invention is preferably selected from the group consisting of:

(1) an unreacted hydrosilylation curable silicone composition;
(2) a hydrosilylation curable silicone composition obtained by partially cross-linking an unreacted hydrosilylation curable silicone composition; and
(3) a hydrosilylation curable silicone composition comprising: a crosslinked product having silicon atom-bonded hydrogen atoms and/or alkenyl groups; and at least one type of hydrosilylation reactive component, the cross-linked product being obtained by cross-linking an unreacted hydrosilylation reactive silicone composition.

The unreacted hydrosilylation curable silicone composition (1) preferably comprises:

(A) at least one type of organopolysiloxane that is solid at 25° C. and has on average more than two alkenyl groups in a molecule;
(B) at least one type of organopolysiloxane having at least two silicon atom-bonded hydrogen atoms in a molecule, in an amount such that a ratio of a total molar of silicon atom-bonded hydrogen atoms to a total molar of alkenyl groups in component (A) being in a range of 0.2 to 4, and
(C) a hydrosilylation catalyst in an amount sufficient to effect a hydrosilylation reaction.

Component (A) can be a mixture of:
(A-1) from 60 to 100 mass % of a branched organopolysiloxane that is solid at 25° C. and has on average more than two alkenyl groups in a molecule; and
(A-2) from 0 to 40 mass % of a straight or partially branched organopolysiloxane that is liquid at 25° C. and has on average at least two alkenyl groups in a molecule.

The hydrosilylation curable silicone composition (2) obtained by partially cross-linking an unreacted hydrosilylation curable silicone composition is preferably obtained by stopping a hydrosilylation reaction at from 50 to 95% conversion of a hydrosilylation curable silicone composition comprising:

(D) at least one type of organopolysiloxane having on average more than two alkenyl groups in a molecule;
(E) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (D) being in a range of 0.2 to 4; and
(F) a hydrosilylation catalyst in an amount sufficient to effect a hydrosilylation reaction.

Component (D) can be a mixture of:
(D-1) an organopolysiloxane represented by the following average unit formula:

$$(R^1{}_3SiO_{1/2})_a(R^1{}_2SiO_{2/2})_b(R^1SiO_{3/2})_c(SiO_{4/2})_d (R^2O_{1/2})_e$$

wherein $R^1$ is a phenyl group, an alkyl group or cycloalkyl group having from 1 to 6 carbon atoms, or an alkenyl group having from 2 to 6 carbon atoms, providing that from 60 to 80 mol % of $R^1$ are phenyl groups and from 10 to 20 mol % of $R^1$ are alkenyl groups; $R^2$ is a hydrogen atom or an alkyl group having from 1 to 6 carbon atoms; and "a", "b", "c", "d", and "e" are numbers that satisfy: $0 \le a \le 0.2$, $0.2 \le b \le 0.7$, $0.2 \le c \le 0.6$, $0 \le d \le 0.2$, $0 \le e \le 0.1$, and $a+b+c+d=1$; and
(D-2) an organopolysiloxane represented by the following general formula:

$$R^3{}_3SiO(R^3{}_2SiO)_mSiR^3{}_3$$

wherein $R^3$ is a phenyl group, an alkyl group or cycloalkyl group having from 1 to 6 carbon atoms, or an alkenyl group having from 2 to 6 carbon atoms, providing that from 40 to 70 mol % of $R^3$ are phenyl groups and at least one of $R^3$ is an alkenyl group; and "m" is an integer from 5 to 100, in an amount of this component being from 0 to 20 parts by weight per 100 parts by weight of component (D-1).

The hydrosilylation curable silicone composition (3) preferably contains:
(G) an alkenyl group-containing crosslinked product obtained by hydrosilylation reaction of an unreacted hydrosilylation reactive silicone composition comprising:
(G-1) at least one type of organopolysiloxane having on average more than two alkenyl groups in a molecule;
(G-2) at least one type of organopolysiloxane having at least two silicon atom-bonded hydrogen atoms in a molecule, in the ratio of the total molar concentration of silicon atom-bonded hydrogen atoms to the total molar concentration of alkenyl groups in component (G-1) being in a range of 0.3 to 0.9; and
(G-3) a hydrosilylation catalyst in an amount sufficient to effect a hydrosilylation reaction; and
(H) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in the crosslinked product being in a range of 0.1 to 2.0.

It is preferable that one of the following conditions be satisfied:
(G-1) is an organopolysiloxane having on average more than two alkenyl groups in a molecule and represented by the following average composition formula:

$$R^4{}_xSiO_{(4-x)/2}$$

wherein $R^4$ independently represents a substituted or unsubstituted monovalent hydrocarbon group, providing that from 0.1 to 40 mol % of $R^4$ are alkenyl groups; and "x" is a positive number that satisfies: $1 \le x < 2$;
(G-2) is a diorganopolysiloxane represented by the following general formula:

$$HR^5{}_2Si(R^5{}_2SiO)_nR^5{}_2SiH$$

wherein $R^5$ independently represents a substituted or unsubstituted monovalent hydrocarbon group not comprising an aliphatic unsaturated bond, and "n" is an integer from 0 to 1,000; and
(H) is an organohydrogenpolysiloxane represented by the following average composition formula:

$$R^5{}_yH_zSiO_{(4-y-z)/2}$$

wherein $R^5$ is as defined above, and "y" and "z" are positive numbers that satisfy: $0.7 \le y \le 2.1$, $0.001 \le z \le 1.0$, and $0.8 \le y+z \le 2.6$.

The hot-melt type curable silicone composition for compression molding or laminating according to the present invention can comprise at least one type of inorganic particle. The inorganic particles are preferably selected from the group consisting of titanium oxide, silica, alumina, barium titanate, beryllium oxide, and mixtures thereof.

The hot-melt type curable silicone composition for compression molding or laminating according to the present invention can comprise at least one type of phosphor. The phosphor is preferably selected from the group consisting of yellow-luminescent phosphors, red-luminescent phosphors, green-luminescent phosphors, and mixtures thereof.

The present invention also relates to a laminate including at least one layer comprising the hot-melt type curable silicone composition for compression molding or laminating.

The laminate according to the present invention can further include at least one layer comprising at least one type of non-hot melt type curable silicone composition.

The curable silicone composition preferably comprises:
(I) 100 parts by mass of raw alkenyl group-containing organopolysiloxane rubber;
(J) from 30 to 150 parts by mass of wet method hydrophobized reinforcing silica comprising an organopolysiloxane unit selected from an $R_3SiO_{1/2}$ unit, an $R_2SiO_{2/2}$ unit, an $RSiO_{3/2}$ unit, (wherein each R independently represents a monovalent hydrocarbon group), and mixtures thereof, and an $SiO_{4/2}$ unit (provided that a molar ratio of organopolysiloxane units to $SiO_{4/2}$ units is from 0.08 to 2.0), and having a specific surface area of at least 200 m²/g as measured according to the BET method;
(K) from 0.1 to 10 parts by mass of an organohydrogenpolysiloxane; and
(L) a curing agent in an amount sufficient to cure the composition.

The laminate according to the present invention preferably further comprises at least one layer containing at least one type of organopolysiloxane block copolymer.

The organopolysiloxane block copolymer preferably comprises:
from 40 to 90 mol % of a disiloxy unit represented by $[R^6{}_2SiO_{2/2}]$;
from 10 to 60 mol % of a trisiloxy unit represented by $[R^7SiO_{3/2}]$; and
from 0.5 to 2.5 mol % of a silanol group represented by $[\equiv SiOH]$;
each $R^6$ independently representing a $C_1$-$C_{30}$ hydrocarbon group;
each $R^7$ independently representing a $C_1$-$C_{20}$ hydrocarbon group;
the disiloxy unit $[R^6{}_2SiO_{2/2}]$ being present in a straight chain block comprising an average of from 10 to 400 disiloxy units $[R^6{}_2SiO_{2/2}]$;
the trisiloxy unit being present in a non-straight chain block having a molecular weight of at least 500 g/mol; and each straight chain block being bonded to at least one non-straight chain block.

The organopolysiloxane block copolymer can have a molecular weight of at least 20,000 g/mol.

The layer comprising the organopolysiloxane block copolymer preferably has a refractive index of at least 1.5.

In the laminate according to the present invention, each of the layers can differ from each other in terms of at least one physical property selected from the group consisting of refractive index, hardness, light transmission rate, water vapor transmission rate, thermal conductivity, thermal expansion, surface tack, elastic modulus, and curing rate.

In the laminate according to the present invention, the hardness and/or refractive index of at least one layer can vary in the through-thickness direction of the layer.

In the laminate according to the present invention, at least one layer can have a patterned shape.

The laminate according to the present invention may be rough-surfaced.

The thickness of the laminate according to the present invention can be in a range from 0.5 to 5 mm.

In the laminate according to the present invention, at least one layer can contain at least one type of inorganic particle.

The inorganic particle-containing layer can have a patterned shape.

The inorganic particles can be selected from the group consisting of titanium oxide, silica, alumina, barium titanate, beryllium oxide, and mixtures thereof.

In the laminate according to the present invention, at least one layer can contain at least one type of phosphor.

The phosphor-containing layer can have a patterned shape.

The phosphor can be selected from the group consisting of yellow-luminescent phosphors, red-luminescent phosphors, green-luminescent phosphors, and mixtures thereof.

The laminate according to the present invention can include at least two layers comprising different types of phosphors.

The present invention also relates to a method of manufacturing a sealed semiconductor device, the method comprising a step of using the hot-melt type curable silicone composition for compression molding or laminating or the laminate to perform compression molding or laminating.

The present invention also relates to a semiconductor device sealed using the hot-melt type curable silicone composition for compression molding or laminating or the laminate.

In accordance with the present invention, it is possible to efficiently manufacture a semiconductor device provided with a hemi-spheroidal lens- or dome-shaped seal. In the present invention, it is easy to control the shape of the seal, and the seal does not contain any bubbles. In the present invention, it is also easy to control the thickness of the coating layer of the semiconductor device apart from the seal.

In particular, the laminate for use in compression molding or laminating according to the present invention allows for layers having different functions to be compression molded or laminated at once, allowing for the manufacture of high-throughput molded products, and allowing the process of manufacturing the semiconductor device to be simplified and manufacturing costs to be reduced.

A material capable of melting when heated is used in the present invention, allowing for a seal to be molded to a shape matching that of a mold, and also yielding a seal of superior optical properties. Meanwhile, performing compression molding upon a material that does not melt when heated creates a skewed internal stress distribution in the material following molding, leading to warping. As a result, cracks, peeling, and the like occur. In addition, the lack of uniformity in the density distribution within the seal negatively affects optical properties.

In the present invention, transfer molding of a liquid sealing resin is not performed, thus avoiding the problems of sealing resin-induced wire displacement, wire deformation, and filling defects associated with transfer molding. In addition, because a silicone material that melts when heated is used, sealing can be performed without excessive wire deformation even if the object of sealing is a wire-bonded semiconductor element.

DESCRIPTION

Figure 1:
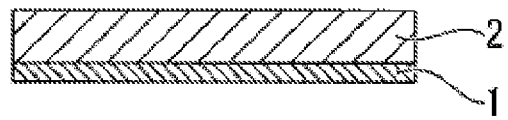
FIG. 1 is a schematic cross-sectional view of an example of a laminate for comp ression molding or laminating according to the present invention, in which a single-layer compression molding or laminating sheet 2 is layered upon a supporter sheet 1.

Generally, when part of a thermoset resin in an unreacted A-stage is reacted, the resin enters a B-stage in which part of the crosslinkable functional groups are reacted. In A-stage and B-stage, the resin can be reduced in viscosity, softened, or liquefied via heating. If the reaction continues, the resin enters a completely cured C-stage. The curable silicone composition according to the present invention is in a state corresponding to "A-stage" or "B-stage", and, in particular, is thermoplastic because a curable silicone composition comprising a component that is solid at room temperature is used. It is therefore possible to plastically work the hot-melt curable silicone composition for compression molding or laminating according to the present invention.

In the context of the present invention, "hot-melt" and "hot-meltable" generally refer to substances that are solid at room temperature (25° C.) but soften or melt when heated, entering a viscous, fluid, or liquid state, such as hot-melt adhesives typified by ethylene vinyl acetate-based adhesives.

The composition of the present invention is a "hot-melt" composition, and therefore can be solid at room temperature (25° C.). There is no particular limitation upon the form of the composition of the present invention; for example, it may take the form of a powder, granules, pellets, tablets, a film, or a sheet.

The composition of the present invention preferably has a type A durometer hardness of at least 50 at 25° C. as defined by JIS K 6253, more preferably at least 60, and still more preferably at least 70. The composition of the present invention preferably is either fluid at 100° C. or has a type A durometer hardness at 100° C. of no more than 10, more preferably no more than 5, and still more preferably no more than 1. If the composition is fluid at 100° C., there is no particular limitation upon the viscosity thereof; a minimum of 0.01 Pa·s is preferable, and 0.1 more preferable. The maximum viscosity if the composition is fluid at 100° C. is preferably 1,000 Pa·s, more preferably 100 Pa·s, and still more preferably 10 Pa·s. Alternatively, if the composition is fluid at 100° C., the minimum torque value from immediately after closing the die (cure time: 0 seconds) until 300 seconds, when measuring at a temperature of at least 100° C. using a moving die rheometer (MDR) according to JIS K 6300-2 "Rubber, unvulcanized—Physical property—Part 2: Determination of cure characteristics with oscillating curemeters", is preferably no more than 1 kgf·cm, more preferably no more than 0.1 kgf·cm. The composition of the present invention can therefore be favorably used as a thermoplastic film or sheet that deforms when heated.

The composition of the present invention is capable of undergoing crosslinking and curing when heated. The minimum heating temperature is preferably 50° C., more preferably 80° C., still more preferably 100° C. The maximum heating temperature is preferably 200° C., more preferably 150° C. In order to stabilize the shape of the seal, the composition of the present invention preferably has curing properties such that the time from immediately after beginning measurement until a torque of 1 kgf·cm is reached, when measuring in a heating temperature range using a moving die rheometer (MDR), is preferably no more than 5 minutes, more preferably no more than 3 minutes, still more preferably no more than 1 minute. Measurement can be performed using the MDR according to a method complying with JIS K 6300-2 "Rubber, unvulcanized—Physical property—Part 2: Determination of cure characteristics with oscillating curemeters".

The composition of the present invention itself, or the cured product thereof, preferably has a refractive index of at least 1.40. The refractive index can be measured using, for example, an Abbe refractometer. In such cases, the wavelength of the light source for the Abbe refractometer can be altered to measure a refractive index at a desired wavelength. The curable silicone composition or cured product thereof preferably has a refractive index (25° C.) at a visible light wavelength (589 nm) of 1.40 or greater, more preferably from 1.50 to 1.70, and still more preferably from 1.55 to 1.60.

The composition of the present invention itself or the cured product thereof preferably has a light transmission rate (at 25° C.) of at least 80%, more preferably at least 90%, and still more preferably at least 95%. This light transmission rate can be calculated, for example, by measuring the composition of the present invention or the cured product thereof using a light transmission rate (at 25° C.) spectrophotometer using a light path distance of 0.2 cm and a wavelength of 450 nm.

The composition of the present invention is preferably, for example, an A-stage silicone composition that comprises a solid organopolysiloxane and is solid at room temperature, or a B-stage silicone composition that can be crosslinked and cured via a hydrosilylation reaction. In particular, the B-stage composition according to the present invention is preferably partially crosslinked via a hydrosilylation reaction, forms a solid with high hardness, specifically, a hard rubber-like state, at room temperature, and either takes on a significantly softened form, specifically, a soft rubber-like state, or preferably liquefies: at high temperatures, such as 100° C.

If the composition of the present invention is capable of being crosslinked and cured via a hydrosilylation reaction, the composition of the present invention is preferably selected from the group consisting of:
(1) an unreacted hydrosilylation curable silicone composition;
(2) a hydrosilylation curable silicone composition obtained by partially cross-linking an unreacted hydrosilylation curable silicone composition; and
(3) a hydrosilylation curable silicone composition comprising: a crosslinked product having silicon atom-bonded hydrogen atoms and/or alkenyl groups; and at least one type of hydrosilylation reactive component, the cross-linked product being obtained by cross-linking an unreacted hydrosilylation reactive silicone composition.

The unreacted hydrosilylation curable (reactive) silicone composition (1) preferably comprises:
(A) at least one type of organopolysiloxane that is solid at 25° C. and has on average more than two alkenyl groups in a molecule;
(B) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (A) being in a range of 0.2 to 4; and
(C) a hydrosilylation catalyst in an amount sufficient to effect a hydrosilylation reaction.

There is no limitation upon the molecular structure of component (A); examples include a straight, partially branched straight, branched, dendritic, reticulated, or cyclic structure.

Examples of the alkenyl group in component (A) include straight or branched alkenyl groups having from 2 to 10 carbons, such as vinyl groups, allyl groups, propenyl groups, isopropenyl groups, butenyl groups, pentenyl groups, and hexenyl groups. A vinyl group or allyl group is preferable, and a vinyl group is more preferable. Component (A) may optionally have on average at least three alkenyl groups in a molecule.

Apart from an alkenyl group, component (A) can comprise a monovalent hydrocarbon group bonded to a silicon atom and having from 1 to 20 carbon atoms. Examples of the monovalent hydrocarbon groups include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

Examples of component (A) include methylvinylpolysiloxane capped at both molecular terminals with trimethylsiloxy groups, copolymers of methylvinylsiloxane and dimethylsiloxane capped at both molecular terminals with trimethylsiloxy groups, methylvinylpolysiloxane capped at both molecular terminals with dimethylvinylsiloxy groups, copolymers of dimethylsiloxane and methylvinylsiloxane capped at both molecular terminals with dimethylvinylsiloxy groups, cyclic methylvinylsiloxane, cyclic dimethylsiloxane-methylvinylsiloxane copolymer, copolymers constituted by siloxane units represented by the formula $(CH_3)_3SiO_{1/2}$, siloxane units represented by the formula $(CH_2=CH)(CH_3)_2SiO_{1/2}$, and siloxane units represented by the formula $SiO_{4/2}$, copolymers constituted by siloxane units represented by the formula $(CH_2=CH)(CH_3)_2SiO_{1/2}$ and siloxane units represented by the formula $SiO_{4/2}$, copolymers of siloxane units represented by the formula $(CH_3)_3SiO_{1/2}$, siloxane units represented by the formula $(CH_2=CH)(CH_3)_2SiO_{1/2}$, siloxane units represented by the formula $(CH_3)_2SiO_{2/2}$, and siloxane units represented by the formula $SiO_{4/2}$, and mixtures of two or more of the above. Dimethylpolysiloxane capped at both molecular terminals with dimethylvinylsiloxy groups, copolymers of dimethylsiloxane and methylvinylsiloxane capped at both molecular terminals with trimethylsiloxy groups, and copolymers of siloxane units represented by the formula $SiO_{4/2}$ and siloxane units represented by the formula $(CH_2=CH)(CH_3)_2SiO_{1/2}$ are especially preferable.

Component (A) is preferably a phenyl group-containing organopolysiloxane represented by the following average unit formula:

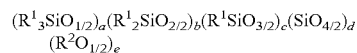

wherein $R^1$ is a phenyl group, an alkyl group or cycloalkyl group having from 1 to 6 carbon atoms, or an alkenyl group having from 2 to 6 carbon atoms, provided that from 60 to 80 mol % of $R^1$ are phenyl groups, and from 10 to 20 mol % of $R^1$ are alkenyl groups;

$R^2$ is a hydrogen atom or an alkyl group having from 1 to 6 carbon atoms; and

"a", "b", "c", "d", and "e" are numbers that satisfy: $0 \le a \le 0.2$, $0.2 \le b \le 0.7$, $0.2 \le c \le 0.6$, $0 \le d \le 0.2$, $0 \le e \le 0.1$, and $a+b+c+d=1$.

Examples of the alkyl group of $R^1$ include methyl groups, ethyl groups, propyl groups, butyl groups, pentyl groups, and hexyl groups. Examples of the cycloalkyl group of $R^1$ include cyclopentyl groups and cyclohexyl groups. Examples of the alkenyl group of $R^1$ include vinyl groups, allyl groups, butenyl groups, pentenyl groups, and hexenyl groups. In the formula, $R^1$ has a phenyl group content in a range of 60 to 80 mol %, more preferably from 65 to 80 mol %. This is because there is a risk of insufficient softening of the composition of the present invention at high temperatures if the phenyl group content is less than the minimum value of the range given above, and a risk of loss of transparency and reduction in mechanical strength of the composition of the present invention or a cured product thereof if the phenyl group content exceeds the maximum value of the range given above. In the formula, $R^1$ has an alkenyl group content in a range of 10 to 20 mol %. This is because there is a risk of failing to obtain sufficient hardness of the composition of the present invention at room temperature if the alkenyl group content is less than the minimum value of the range given above, and a risk of insufficient softening of the composition of the present invention at high temperatures if the alkenyl group content exceeds the maximum value of the range given above.

Examples of the alkyl group of $R^2$ include methyl groups, ethyl groups, propyl groups, butyl groups, pentyl groups, and hexyl groups, with methyl groups and ethyl groups being preferable.

In the formula, "a" is a number indicating the fraction of siloxane units represented by the general formula: $R^1_3SiO_{1/2}$, and "a" is a number satisfying 0≤a—0.2, and preferably 0≤a≤0.1. This is because there is a risk of failing to obtain sufficient hardness of the composition of the present invention at room temperature if "a" exceeds the maximum value of the range given above. In the formula, "b" is a number indicating the fraction of siloxane units represented by the general formula: $R^1_2SiO_{2/2}$, and "b" is a number satisfying 0.2≤b≤0.7, and preferably 0.4≤b≤0.7. This is because there is a risk of insufficient softening of the composition of the present invention at high temperatures if "b" is less than the minimum value of the range given above, and a risk of failing to obtain sufficient hardness of the composition of the present invention at room temperature if "b" exceeds the maximum value of the range given above. In the formula, "c" is a number indicating the fraction of siloxane units represented by the general formula: $R^1SiO_{3/2}$, and "c" is a number satisfying 0.2≤c≤0.6, and preferably 0.3≤c≤0.6. This is because there is a risk of failing to obtain sufficient hardness of the composition of the present invention at room temperature if "c" is less than the minimum value of the range given above, and a risk of insufficient softening of the composition of the present invention at high temperatures if "c" exceeds the maximum value of the range given above. In the formula, "d" is a number indicating the fraction of siloxane units represented by the general formula: $SiO_{4/2}$, and "d" is a number satisfying 0≤d≤0.2, and preferably 0≤d≤0.1. This is because there is a risk of insufficient softening of the composition of the present invention at high temperatures if "d" exceeds the maximum value of the range given above. In the formula, "e" is a number indicating the fraction of units represented by the general formula: $R^2O_{1/2}$, and "e" is a number satisfying 0≤e≤0.1. This is because there is a risk of failing to obtain sufficient hardness of the composition of the present invention at room temperature if "e" exceeds the maximum value of the range given above. Furthermore, the sum of "a", "b", "c", and "d" in the formula is 1.

In particular, component (A) can be a mixture of:
(A-1) from 60 to 100 mass % of a branched organopolysiloxane that is solid at 25° C. and has on average more than two alkenyl groups in a molecule; and
(A-2) from 0 to 40 mass % of a straight or partially branched organopolysiloxane that is liquid at 25° C. and has on average more than two alkenyl groups in a molecule.

Component (A-1) is the primary component of the composition, and can be the component already described as component (A).

Component (A-2) is a component for improving the ease of handling and workability of the composition and modifying the hardness thereof at room temperature, and is preferably a phenyl group-containing organopolysiloxane represented by the following general formula:

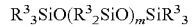

$$R^3_3SiO(R^3_2SiO)_mSiR^3_3$$

wherein
$R^3$ is a phenyl group, an alkyl group or cycloalkyl group having from 1 to 6 carbon atoms, or an alkenyl group having from 2 to 6 carbon atoms, provided that from 40 to 70 mol % of $R^3$ are phenyl groups, and at least one of $R^3$ is an alkenyl group; and
"m" is an integer from 5 to 100.

Examples of the alkyl group of $R^3$ include methyl groups, ethyl groups, propyl groups, butyl groups, pentyl groups, and hexyl groups. Examples of the cycloalkyl group of $R^3$ include cyclopentyl groups and cyclohexyl groups. Examples of the alkenyl group of $R^3$ include vinyl groups, allyl groups, butenyl groups, pentenyl groups, and hexenyl groups. In the formula, $R^3$ has a phenyl group content in a range of 40 to 70 mol %, more preferably from 40 to 60 mol %. This is because there is a risk of insufficient softening of the composition of the present invention at high temperatures if the phenyl group content is less than the minimum value of the range given above, and a risk of loss of transparency and reduction in mechanical strength in the cured composition of the present invention if the phenyl group content exceeds the maximum value of the range given above. Moreover, at least one of $R^3$ is an alkenyl group. This is because there is a risk of the component not being incorporated into the crosslinking reaction and bleeding out of the composition of the present invention if there is no alkenyl group.

In the formula, "m" is an integer in a range of 5 to 100, and preferably is an integer in a range of 10 to 50. This is because there is a risk of the mechanical strength of the composition of the present invention being diminished if "m" is less than the minimum value of the range given above, and the ease of handling and workability of the composition of the present invention being diminished if "m" exceeds the maximum value of the range given above.

Component (B) functions as a crosslinking agent, and preferably has a viscosity at 25° C. in a range of 1 to 1,000 mPa·s, more preferably in a range of 1 to 500 mPa·s, still more preferably in a range of 1 to 100 mPa·s.

There is no limitation upon the molecular structure of component (B); examples include a straight, partially branched straight, branched, dendritic, reticulated, or cyclic structure. Component (B) may optionally have at least three silicon-bonded hydrogen atoms in a molecule.

Apart from a silicon atom-bonded hydrogen atom, component (B) can have a monovalent hydrocarbon group bonded to a silicon atom and having from 1 to 20 carbon atoms. Examples of the monovalent hydrocarbon groups include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms in component (B) include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

Examples of component (B) include methylhydrogenpolysiloxane capped at both molecular terminals with trimethylsiloxy groups, copolymer of dimethylsiloxane and methyl hydrogensiloxane capped at both molecular terminals with trimethylsiloxy groups, methylhydrogenpolysiloxane capped at both molecular terminals with dimethylhydrogensiloxy groups, copolymer of dimethylsiloxane and methylhydrogensiloxane capped at both molecular terminals with dimethylhydrogensiloxy groups, cyclic methylhydrogensiloxane, cyclic dimethylsiloxane-methylhydrogensiloxane copolymer, copolymers of siloxane units represented by the formula $(CH_3)_3SiO_{1/2}$, siloxane units represented by the formula $H(CH_3)_2SiO_{1/2}$ and siloxane units represented by the formula $SiO_{4/2}$, copolymers of siloxane units represented by the formula $H(CH_3)_2SiO_{1/2}$ and siloxane units represented by the formula $SiO_{4/2}$, copolymers of siloxane units represented by the formula $(CH_3)_3SiO_{1/2}$, siloxane units represented by the formula $H(CH_3)_2SiO_{1/2}$, siloxane units represented by the formula $(CH_3)_2SiO_{2/2}$ and siloxane units represented by the formula $SiO_{4/2}$, and mixtures of two or more of these; in particular, methylhydrogenpolysiloxane capped at both molecular terminals with trimethylsiloxy groups, copolymer of dimethylsiloxane and methylhydrogensiloxane capped at both molecular terminals with trimethylsiloxy groups, and copolymers of siloxane units represented by the formula $SiO_{4/2}$ and siloxane units represented by the formula $H(CH_3)_2SiO_{1/2}$ are preferable.

Preferably from 30 to 70 mol % of the monovalent hydrocarbon groups of component (B) are phenyl groups. This is because there is a risk of insufficient softening of the composition of the present invention at high temperatures if the phenyl group content is less than the minimum value of the range given above, and a risk of loss of transparency and reduction in mechanical strength in the cured composition of the present invention if the phenyl group content exceeds the maximum value of the range given above.

Component (B) is preferably an organotrisiloxane represented by the following general formula:

$$(HR^4_2SiO)_2SiR^4_2$$

In the formula, $R^4$ is a phenyl group, or an alkyl group or cycloalkyl group having from 1 to 6 carbon atoms. Examples of the alkyl group of $R^4$ include methyl groups, ethyl groups, propyl groups, butyl groups, pentyl groups, and hexyl groups. Examples of the cycloalkyl group of $R^4$ include cyclopentyl groups and cyclohexyl groups. The phenyl group content of $R^4$ is in a range of 30 to 70 mol %.

Component (B) content is an amount such that the molar ratio of silicon atom-bonded hydrogen atoms therein to the total amount of alkenyl groups in component (A) is in a range of 0.2 to 4, preferably from 0.5 to 2, more preferably from 0.8 to 1.8, and still more preferably from 0.5 to 1.5. This is because there is a risk of failing to obtain sufficient hardness of the composition of the present invention at room temperature if the content of component (B) is outside the range given above.

Component (C) is a hydrosilylation reaction catalyst for causing or promoting a hydrosilylation reaction between the alkenyl groups of component (A) and the silicon atom-bonded hydrogen atoms of component (B). Examples of component (C) include platinum-based catalysts, rhodium-based catalysts, and palladium-based catalysts. Platinum-based catalysts are preferred due to the ability to remarkably promote curing of the present composition. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being particularly preferred. Examples of the alkenylsiloxane include 1,3-divinyl-1,1,3,3-tetramethyldisiloxane, 1,3,5,7-tetramethyl-1,3,5,7-tetravinylcyclotetrasiloxane, alkenylsiloxanes having part of the methyl groups of these alkenylsiloxane substituted by ethyl groups, phenyl groups, or the like, and alkenylsiloxanes having vinyl groups of these alkenylsiloxane substituted by allyl groups, hexenyl groups, or the like. 1,3-divinyl-1,1,3,3-tetramethyldisiloxane is particularly preferred due to high stability of the platinum-alkenylsiloxane complex. Due to the ability for improving the stability of the platinum-alkenylsiloxane complexes, combination is recommended of the platinum-alkenylsiloxane complexes with organosiloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinyl cyclotetrasiloxane, or the like alkenylsiloxane, or dimethylsiloxane oligomers. The addition of alkenylsiloxanes is particularly preferred.

There is no particular limitation upon component (C) content as long as it is an amount sufficient to effect or promote a hydrosilylation reaction between the alkenyl groups of component (A) and the silicon atom-bonded hydrogen atoms of component (B), but it is preferably an amount such that the amount of metal elements in terms of mass units in the component with respect to the composition prior to partial curing is within a range from 0.01 to 500 ppm, more preferably from 0.01 to 100 ppm, and especially preferably from 0.01 to 50 ppm. This is because the composition exhibits a tendency not to sufficiently crosslink if the amount of component (C) is less than the lower limit of the range described above, and problems such as discoloration of the composition according to the present invention may occur if the amount exceeds the upper limit of the range described above.

The hydrosilylation curable silicone composition (2) obtained by partially cross-linking an unreacted hydrosilylation curable silicone composition is preferably obtained by stopping a hydrosilylation reaction at from 50 to 95% conversion of a hydrosilylation reactive silicone composition comprising:

(D) at least one type of organopolysiloxane having on average more than two alkenyl groups in a molecule;

(E) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (D) being in a range of 0.2 to 4; and (F) a hydrosilylation catalyst in an amount sufficient to effect a hydrosilylation reaction.

Components (A) to (C) described above can be used for components (D) to (F), respectively.

There is no particular limitation upon the viscosity of the unreacted hydrosilylated curable silicone composition, but it is preferably in a range of 100 to 1,000,000 mPa·s, especially preferably from 500 to 50,000 mPa·s. This is because there is a risk of the mechanical strength of the composition of the present invention being diminished if the viscosity is less than the minimum value of the range given above, and the ease of handling and workability of the composition of the present invention being diminished if the viscosity exceeds the maximum value of the range given above.

Component (D) is preferably a mixture of:

(D-1) an organopolysiloxane represented by the following average unit formula:

$$(R^1_3SiO_{1/2})_a(R^1_2SiO_{2/2})_b R^1SiO_{3/2})_c(SiO_{4/2})_d (R^2O_{1/2})_e$$

wherein $R^1$ is a phenyl group, an alkyl group or cycloalkyl group having from 1 to 6 carbon atoms, or an alkenyl group having from 2 to 6 carbon atoms, providing that from 60 to 80 mol % of $R^1$ are phenyl groups and from 10 to 20 mol % of $R^1$ are alkenyl groups; $R^2$ is a hydrogen atom or an alkyl group having from 1 to 6 carbon atoms; and "a", "b", "c", "d", and "e" are numbers that satisfy: $0 \le a \le 0.2$, $0.2 \le b \le 0.7$, $0.2 \le c \le 0.6$, $0 \le d \le 0.2$, $0 \le e \le 0.1$, and $a+b+c+d=1$; and (D-2) an organopolysiloxane represented by the following general formula:

$$R^3{}_3SiO(R^3{}_2SiO)_mSiR^3{}_3$$

wherein $R^3$ is a phenyl group, an alkyl group or cycloalkyl having from 1 to 6 carbon atoms, or an alkenyl group having from 2 to 6 carbon atoms, providing that from 40 to 70 mol % of $R^3$ are phenyl groups and at least one of $R^3$ is an alkenyl group; and "m" is an integer from 5 to 100, in an amount of this component being from 0 to 20 parts by weight per 100 parts by weight of component (D-1).

In the abovementioned formula, $R^1$, $R^2$, $R^3$, "a", "b", "c", "d", "e", and "m" are as defined above.

Component (D-2) content may be an amount in a range of 0 to 15 parts by weight per 100 parts by weight of component (D-1), or an amount in a range of 0 to 10 parts by weight. This is because there is a risk of insufficient softening of the composition of the present invention at high temperatures if component (D-2) content exceeds the maximum value of the range given above.

The "conversion" of the hydrosilylation reaction is the degree of consumption of the alkenyl groups of component (D) or the silicon atom-bonded hydrogen atoms of component (E); for example, 80% conversion indicates that 80% of the alkenyl groups of component (D) or the silicon atom-bonded hydrogen atoms of component (E) have been consumed in the hydrosilylation reaction.

There is no particular limitation upon the method used to control conversion; for example, the unreacted hydrosilylation curable silicone composition can be heated for a comparatively short time to yield a conversion of from 50 to 95%. The heating temperature is preferably from 50 to 200° C., more preferably from 80 to 150° C. The heating time is preferably from 1 to 20 minutes, more preferably from 5 to 15 minutes. Conversion can be measured against, for example, the heat-generating peak area obtained by measuring the unreacted composition via differential scanning calorimetry (DSC) as a reference.

The hydrosilylation curable silicone composition (3) preferably contains:

(G) an alkenyl group-containing crosslinked product obtained by hydrosilylation reaction of an unreacted hydrosilylation reactive silicone composition comprising:

(G-1) at least one type of organopolysiloxane having on average more than two alkenyl groups in a molecule;

(G-2) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (G-1) being in a range of 0.3 to 0.9; and (G-3) a hydrosilylation catalyst in an amount sufficient to effect a hydrosilylation reaction; and (H) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in the crosslinked product being in a range of 0.1 to 2.0.

Components (A), (B), (C), and (C) described above can be used for the components (G-1), (G-2), (G-3), and (H), respectively.

However, It is preferable that one of the following conditions be satisfied: (G-1) is an organopolysiloxane having on average more than two alkenyl groups in a molecule and represented by the following average composition formula:

$$R^4{}_xSiO_{(4-x)/2}$$

wherein $R^4$ independently represents a substituted or unsubstituted monovalent hydrocarbon group, provided that from 0.1 to 40 mol % of $R^4$ are alkenyl groups; and "x" is a positive number such that $1 \le x < 2$;

(G-2) is a diorganopolysiloxane represented by the following general formula:

$$HR^5{}_2Si(R^5{}_2SiO)_nR^5{}_2SiH$$

wherein $R^5$ independently represents a substituted or unsubstituted monovalent hydrocarbon group not comprising an aliphatic unsaturated bond, and "n" is an integer from 0 to 1,000; and (H) is an organohydrogenpolysiloxane represented by the following average composition formula:

$$R^5{}_yH_zSiO_{(4-y-z)/2}$$

wherein $R^5$ is as defined above, and "y" and "z" are positive numbers that satisfy: $0.7 \le y \le 2.1$, $0.001 \le z \le 1.0$, and $0.8 \le y+z \le 2.6$.

The monovalent hydrocarbon group and alkenyl group are as described above. Examples of the monovalent hydrocarbon groups not comprising an aliphatic unsaturated bond include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

In the hydrosilylation curable silicone composition (3), the relative amounts of components (G-1) and (G-2) are adjusted so that the ratio of the total molar concentration of silicon atom-bonded hydrogen atoms in component (G-2) to the total molar concentration of alkenyl groups in component (G-1) is in a range of 0.3 to 0.9; thus, the crosslinked product obtained by hydrosilylating the unreacted hydrosilylation reactive silicone composition (G) has alkenyl groups not consumed in the hydrosilylation reaction. It is therefore possible to further crosslink and cure the hydrosilylation curable silicone composition (3) via a hydrosilylation reaction as a result of the presence of component (H).

The composition of the present invention may comprise, as an optional component, a reaction retarder such as ethynyl hexanol, 2-methyl-3-butyn-2-ol, 3,5-dimethyl-1-hexyn-3-ol, 2-phenyl-3-butyn-2-ol, or another other alkyne alcohol; 3-methyl-3-penten-1-yne, 3,5-dimethyl-3-hexen-1-yne, or another enyne compound; 1,3,5,7-tetramethyl-1,3,5,7-tetravinylcyclotetrasiloxane, 1,3,5,7-tetramethyl-1,3,5,7-tetrahexenylcyclotetrasiloxane, or benzotriazole. There is no limitation upon the reaction retarder content, but an amount in a range of 1 to 5,000 ppm with respect to the weight of the composition is preferable.

The composition of the present invention also preferably comprises an adhesion promoter in order to improve bondability to various substrates. Examples of the adhesion promoters include: organosilanes or linear, branched, or cyclic organosiloxane oligomers having approximately 4 to 20 silicon atoms having a trialkoxysiloxy group (e.g., a trimethoxysiloxy group or triethoxysiloxy group) or a trialkoxysilylalkyl group (e.g., a trimethoxysilylethyl group or triethoxysilylethyl group) and a hydrosilyl group or alkenyl group (e.g., a vinyl group or allyl group); organosilanes or linear, branched, or cyclic organosiloxane oligomers having approximately 4 to 20 silicon atoms having a trialkoxysiloxy group or trialkoxysilylalkyl group, and a methacryloxyalkyl group (e.g., a 3-methacryloxypropyl group); organosilanes or linear, branched, or cyclic organosiloxane oligomers having approximately 4 to 20 silicon atoms having a trialkoxysiloxy group or trialkoxysilylalkyl group, and an epoxy group-bonded alkyl group (e.g., a 3-glycidoxypropyl group, 4-glycidoxybutyl group, 2-(3,4-epoxycyclohexyl) ethyl group, or 3-(3,4-epoxycyclohexyl)propyl group); and reaction products of aminoalkyltrialkoxysilanes and epoxy group-bonded alkyltrialkoxysilanes, and epoxy group-containing ethyl polysilicate. Specific examples of the adhesion promoters include: vinyl trimethoxysilane, allyl trimethoxysilane, allyl triethoxysilane, hydrogen triethoxysilane, 3-glycidoxypropyl trimethoxysilane, 3-glycidoxypropyl triethoxysilane, 2-(3,4-epoxy cyclohexyl)ethyl trimethoxysilane, 3-methacryloxypropyl trimethoxysilane, 3-methacryloxypropyl triethoxysilane, reaction products of 3-glycidoxypropyl triethoxysilane and 3-aminopropyl triethoxysilane, condensation reaction products of silanol group chain-terminated methylvinylsiloxane oligomers and 3-glycidoxypropyltrimethoxysilane, condensation reaction products of silanol group chain-terminated methylvinylsiloxane oligomers and 3-methacryloxypropyl triethoxysilane, and tris(3-trimethoxysilylpropyl) isocyanurate.

The composition of the present invention may further comprise, as optional components, an organopolysiloxane other than components (A) to (H); an inorganic filler such as silica, glass, alumina, or zinc oxide; a fine-powdered organic resin such as polymethacrylate resin; a heat resistance agent; a dye; a pigment; a phosphor; a flame resistance agent; a solvent; or the like to the extent that the object of the present invention is not impeded.

The present invention also relates to a single-layer compression molding or laminating sheet comprising the composition of the present invention. At least 50 weight % of the single-layer compression molding or laminating sheet of the present invention is constituted by the composition, preferably at least 70 weight %, more preferably 90 weight %; it is especially preferable that the sheet be constituted only by the composition.

The composition and single-layer compression molding or laminating sheet according to the present invention can comprise at least one type of inorganic particle. A combination of two or more types of inorganic particles may also be used. It is thereby possible to control, for example, the color, insulating properties, dielectric constant, thermal conductivity, strength, refractive index, water vapor transmission rate, and the like of the composition and single-layer compression molding or laminating sheet according to the present invention. The inorganic particles can be selected, for example, from the group consisting of titanium oxide, silica, alumina, barium titanate, beryllium oxide, and mixtures thereof. As a particle size especially favorable for manufacturing a white seal, the minimum size is preferably at least 100 nm, more preferably at least 300 nm. The maximum size is preferably no more than 10 µm, more preferably no more than 1 µm. This is because, if the particle size exceeds the maximum value, light may be absorbed by the inorganic particles, reducing reflectivity, and, if the particle size is smaller than the minimum value, the inorganic particles will have difficulty in favorably reflecting visible wavelengths. The use of titanium oxide and crushed silica in particular allows for the favorable manufacture of a white seal. As a particle size favorable for controlling properties while suppressing light dispersion by the inorganic particles and maintaining transparency, a maximum value of 1 µm or less is preferable, 300 nm or less is more preferable, and 100 nm or less still more preferable. The inorganic particles used in the present invention are not limited to these, and the following types of inorganic particles can also be used: cerium oxide, yttrium oxide, niobium oxide, tantalum oxide, zinc oxide, magnesium oxide, indium tin oxide, zirconium dioxide, copper oxide, iron oxide, a magnetic powder, carbon particles, carbon nanotubes, fullerene, boron nitride, aluminum nitride, barium sulfate, and lead sulfide.

The composition and single-layer compression molding or laminating sheet according to the present invention can comprise at least one type of phosphor. A combination of two or more types of phosphors may also be used. It is thereby possible, if, for example, the composition or single-layer compression molding or laminating sheet according to the present invention is used to seal a light-emitting body such as an LED, allowing the wavelength of the emitted light to be converted, and the color of the light emitted by the LED or the like to be adjusted. In addition, because the phosphor is comprised within the sheet, the LED or other light-emitting body can easily be positioned, and the color thereof easily adjusted. Compression molding or laminating can also be performed immediately after adjusting the light emission color to efficiently obtain a seal. Moreover, because the phosphor is not present in a liquid, there is no settling of the phosphor during storage which could lead to a non-uniform concentration distribution.

The phosphor may be any known phosphor, and, in order to increase the thickness of the single-layer sheet and favorably convert wavelengths, the minimum content of phosphor is preferably at least 0.01 weight % with respect to the total weight of the single-layer compression molding or laminating sheet according to the present invention, more preferably at least 0.1 weight %, still more preferably at least 1 weight %. In order to favorably convert wavelengths while reducing the thickness of the single-layer sheet, the minimum content of phosphor is preferably 10 weight %, more preferably 20 weight %, still more preferably 50 weight %. In order to favorably convert wavelengths while reducing the thickness of the single-layer sheet, the maximum content of phosphor is preferably 95 weight %, more preferably 90 weight %, still more preferably 80 weight %, and even more preferably 50 weight %. In order to favorably convert wavelengths while increasing the thickness of the single-layer sheet, the maximum content of phosphor is preferably 30 weight %, more preferably 20 weight %, and still more preferably 10 weight %. The phosphor has a particle size range as measured, for example, in particle distribution measurement via a laser photodiffraction method utilizing a CILAS laser measurement device or the like, such that particle size is preferably at least 10 nm, more preferably from 10 nm to 10 μm, still more preferably from 10 nm to 1 μm.

There is no particular limitation upon the thickness of the single-layer compression molding or laminating sheet according to the present invention; for example, from 10 μm to 10 mm is possible, with from 20 μm to 5 mm being preferable. Ease of handling may be negatively affected if the thickness is less than the minimum value of the range given above, and uniformity of heat conductivity may be degraded if the maximum value of the range given above is exceeded.

The phosphor may be any phosphor that is capable of absorbing, for example, light from an LED and converting the light to a different wavelength. Examples include one or more of nitride and oxynitride phosphors primarily activated by a lanthanide element such as europium or cerium, alkaline earth halogen apatite phosphor primarily activated by a lanthanide such as europium or a transition metal element such as manganese, alkali earth metal boric acid halogen phosphors, alkali earth metal aluminate phosphors, alkaline earth silicate phosphors, alkaline earth sulfide phosphors, alkaline earth thiogallate phosphors, alkaline earth silicon nitride phosphors, germanate phosphors, rare earth luminate phosphors primarily activated by a lanthanide element such as cerium, rare earth silicate phosphors, organic and organic complex phosphors primarily activated by a lanthanide element such as europium, and Ca—Al—Si—O—N based oxynitride glass phosphors. Specific examples of acceptable phosphors are listed below, but the present invention is not limited thereto.

An example of the nitride phosphor primarily activated by a lanthanide element such as europium or cerium includes $M_2Si_5N_8$:Eu (wherein M is at least one selected from strontium, calcium, barium, magnesium and zinc). In addition to $M_2Si_5N_8$:Eu, other examples include $MSi_7N_{10}$:Eu, $M_{1.8}Si_5O_{0.2}N_8$:Eu, and $M_{0.9}Si_7O_{0.1}N_{10}$:Eu (wherein M is at least one selected from strontium, calcium, barium, magnesium and zinc).

An example of the oxynitride phosphor primarily activated by a lanthanide element such as europium or cerium includes $MSi_2O_2N_2$:Eu (wherein M is at least one selected from strontium, calcium, barium, magnesium and zinc).

An example of the alkaline earth halogen apatite phosphor primary activated by a lanthanide element such as europium or a transition metal element such as manganese includes $M_5(PO_4)_3X$:R (wherein M is at least one selected from strontium, calcium, barium, magnesium and zinc; X is at least one selected from fluorine, chlorine, bromium, and iodine; and R is at least one selected from europium, manganese, or europium and manganese).

An example of the alkali earth metal boric acid halogen phosphor includes $M_2B_5O_9X$:R (wherein M is at least one selected from strontium, calcium, barium, magnesium and zinc; X is at least one selected from fluorine, chlorine, bromium, and iodine; and R is at least one selected from europium, manganese, or europium and manganese).

Examples of the alkali earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (wherein R is at least one selected from europium, manganese, or europium and manganese).

Examples of the alkaline earth sulfide phosphors include $La_2O_2S$:Eu, $Y_2O_2S$:Eu, and $Gd_2O_2S$:Eu.

An example of the rare earth aluminate phosphor primarily activated by a lanthanide element such as cerium includes a YAG phosphor represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$. Other examples include phosphors in which the yttrium is partially or entirely substituted by terbium, lutetium, or the like, such as $Tb_3Al_5O_{12}$:Ce and $Lu_3Al_5O_{12}$:Ce.

Other phosphors include ZnS:Eu, $Zn_2GeO_4$:Mn, and $MGa_2S_4$:Eu (wherein M is at least one selected from strontium, calcium, barium, magnesium and zinc; and X is at least one selected from fluorine, chlorine, bromium, and iodine).

The abovementioned phosphors can also contain, instead of or in addition to europium, at least one selected from terbium, copper, silver, gold, chromium, neodymium, dysprosium, cobalt, nickel, and titanium.

A Ca—Al—Si—O—N based oxynitride glass phosphor is a phosphor constituted by an oxynitride glass as a matrix material, and comprising from 20 to 50 mol % $CaCO_3$ in terms of CaO, from 0 to 30 mol % $Al_2O_3$, from 25 to 60 mol % SiO, from 5 to 50 mol % AlN, and from 0.1 to 20 mol % of a rare earth oxide or transition metal oxide, the total of the five components being 100 mol %. The phosphor constituted by an oxynitride glass as a matrix material preferably contains no more than 15 weight % nitrogen, and the fluorescent glass preferably contains, apart from the rare earth oxide ion, from 0.1 to 10 mol % of another rare earth element ion constituting a sensitizer as a rare earth oxide as a co-activator.

Another phosphor other than that described above and having similar properties and effects can also be used.

The single-layer compression molding or laminating sheet according to the present invention can be manufactured by mixing the composition according to the present invention and one or more of the inorganic particles and/or phosphors described above as necessary, and heating the obtained mixture for a comparatively short time to partially crosslink it. The heating temperature is preferably from 50 to 200° C., more preferably from 80 to 150° C. The heating time is preferably from 1 to 20 minutes, more preferably from 5 to 15 minutes. The composition according to the present invention or the mixture forms a single-layer compression molding or laminating sheet of the present invention that is partially crosslinked via a hydrosilylation reaction and is a solid with high hardness at room temperature, and that is a crosslinked product that softens or liquefies at high temperatures, such as 100° C.

The present invention also relates to a laminate comprising at least one layer containing the composition according to the present invention, especially a laminate provided with the single-layer compression molding or laminating sheet and at least one other sheet.

There is no particular limitation upon the thickness of the laminate according to the present invention; for example, from 10 μm to 10 mm is possible, from 100 μm to 8 mm is preferable, and from 0.5 to 5 mm is more preferable. Ease of handling may be negatively affected if the thickness is less than the minimum value of the range given above, and uniformity of heat conductivity may be degraded if the maximum value of the range given above is exceeded.

There is no particular limitation upon the thickness of the other sheet, which may have the same thickness as the single-layer compression molding or laminating sheet according to the present invention, or may be thinner, as necessary, in which case a thickness of, for example, from 0.1 μm to 3 mm is possible, with from 1 μm to 2 mm being preferable.

The other sheet may be a supporter sheet for supporting the single-layer compression molding or laminating sheet. The supporter sheet may be a single-layer sheet, or a multi-layer sheet in which a plurality of films are layered. The other sheet may also be a protective sheet for preventing dust and the like from adhering to the single-layer compression molding or laminating sheet. There is no particular limitation upon the material of the supporter sheet as long as it is capable of supporting the single-layer compression molding or laminating sheet. There is no particular limitation upon the material of the protective sheet as long as it is capable of being peeled from the single-layer compression molding or laminating sheet. Examples of supporter sheet and protective sheet materials include polyethylene, polypropylene, polycarbonate, polyethylene terephthalate, polybutylene terephthalate, polyamide, polyvinylidene chloride, polystyrene, polyvinyl alcohol, polyimide, polytetrafluoroethylene, ethylene-tetrafluoroethylene copolymer resin, cellulose triacetate, and the like. A surface-treating agent such as a fluorine-containing release agent or a silicone-containing release agent may be applied to the surface of the supporter sheet or protective sheet. The supporter sheet may be peeled off before or during compression molding or laminating. The supporter sheet may be machined simultaneously with the silicone composition layer; in such cases, the sheet may be peeled off the silicone composition layer after machining, or may be left bonded to the silicone composition layer.

FIG. 1 is a schematic cross-sectional view of one example of a laminate according to the present invention in which the single-layer compression molding or laminating sheet 2 is layered upon a supporter sheet 1.

Figure 2:
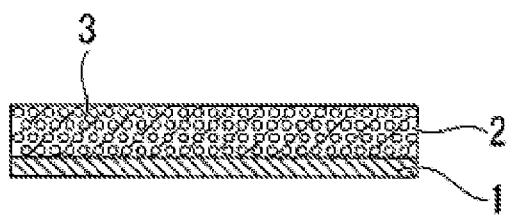
FIG. 2 is a schematic cross-sectional view of an example of a laminate for compression molding or laminating according to the present invention, in which a single-layer compression molding or laminating sheet 2 according to the present invention, comprising a phosphor 3, is layered upon a supporter sheet 1.

FIG. 2 is a schematic cross-sectional view of one example of a laminate according to the present invention in which the single-layer compression molding or laminating sheet 2 comprising inorganic particles and/or a phosphor 3 is layered upon a supporter sheet 1. The size of the inorganic particles and/or phosphor 3 has been magnified.

The laminate according to the present invention shown in FIGS. 1 and 2 can be manufactured by applying the composition according to the present invention, or a mixture of the composition and one or more types of the inorganic particles and/or phosphors described above, to the supporter sheet 1 and, for example, heating for a comparatively short time to cause partial crosslinking. The heating temperature is preferably from 50 to 200° C., more preferably from 80 to 150° C. The heating time is preferably from 1 to 20 minutes, more preferably from 5 to 15 minutes. The composition according to the present invention or the mixture forms a single-layer compression molding or laminating sheet 2 that is partially crosslinked via a hydrosilylation reaction and is a solid with high hardness at room temperature, and that is a crosslinked product that softens or liquefies at high temperatures, such as 100° C.

The other sheet may comprise at least one type of non-hot melt curable silicone composition.

The curable silicone composition preferably comprises:
(I) 100 parts by mass of raw alkenyl group-comprising organopolysiloxane rubber;
(J) from 30 to 150 parts by mass of wet method hydrophobized reinforcing silica comprising an organopolysiloxane unit selected from an $R_3SiO_{1/2}$ unit, an $R_2SiO_{2/2}$ unit, an $RSiO_{3/2}$ unit (wherein each R independently represents a monovalent hydrocarbon group), and mixtures thereof, and an $SiO_{4/2}$ unit (provided that a molar ratio of organopolysiloxane units to $SiO_{4/2}$ units is from 0.08 to 2.0), and having a specific surface area of at least 200 m²/g as measured according to the BET method;
(K) from 0.1 to 10 parts by mass of an organohydrogenpolysiloxane; and
(L) a curing agent in an amount sufficient to cure the composition.

Component (I) is typically referred to as a raw organopolysiloxane rubber, and a substance used as a primary agent of millable silicone rubbers may be used. A typical example of such a raw organopolysiloxane rubber is a raw alkenyl group-containing organopolysiloxane rubber represented by the average unit formula $R'_a SiO_{4-a/2}$ (wherein R' is a monovalent hydrocarbon group, and "a" is from 1.9 to 2.1).

Examples of the alkenyl groups and monovalent hydrocarbon groups include those already given above.

The alkenyl group-containing raw organopolysiloxane rubber for component (I) preferably has at least two silicon-bonded alkenyl groups in a molecule. The molecular structure of component (I) may be either a straight chain or a branched chain structure. Examples of the bond positions of the alkenyl groups in component (I) are molecular chain terminals and/or molecular side chains. The degree of polymerization of this component is ordinarily from 3,000 to 20,000, and the mass-average molecular mass is at least $20 \times 10^4$. The viscosity of this component at 25° C. is at least $10^6$ mPa·s, and the Williams plasticity number (JIS K 6249) at 25° C. is at least 50 and preferably at least 100. The state of the component is a raw rubber state.

Component (I) may be a homopolymer, a copolymer, or a mixture of these polymers. Specific examples of the siloxane unit constituting this component include dimethylsiloxane units, methylvinylsiloxane units, methylphenylsiloxane units, and 3,3,3-trifluoropropylmethylsiloxane units. The molecular chain terminal of component (A) is preferably capped at molecular chain terminals by a triorganosiloxane group or a hydroxyl group, and examples of groups present at the molecular chain terminal include trimethylsiloxy groups, dimethylvinylsiloxy groups, methylvinylhydroxysiloxy groups, and dimethylhydroxysiloxy groups. Examples of such an raw organopolysiloxane rubber include dimethylsiloxane-methylvinylsiloxane copolymer raw rubbers capped at both molecular teminals with dimethylvinylsiloxy groups, dimethylpolysiloxane raw rubbers capped at both molecular teminals with dimethylvinylsiloxy groups, dimethylsiloxane-methylvinylsiloxane copolymer raw rubbers capped at both molecular teminals with dimethylhydroxysiloxy groups, and dimethylsiloxane-methylvinylsiloxane copolymer raw rubbers capped at both molecular teminals with methylvinylhydroxysiloxy groups.

The wet hydrophobized reinforcing silica for component (J) has the function of increasing the mechanical strength in the uncured state and after curing. The wet hydrophobized reinforcing silica also has the function of providing adhesiveness—adhesive durability, in particular—to an LED chip or the like. Such component (J) is a wet hydrophobized reinforcing silica having a BET method specific surface area of at least 200 m²/g, the silica comprising an organopolysiloxane unit selected from the group consisting of $R_3SiO_{1/2}$ units, $R_2SiO_{2/2}$ units, $RSiO_{3/2}$ units (where R is each independently a monovalent hydrocarbon group exemplified by alkyl groups such as methyl groups, ethyl groups, and propyl groups, or aryl groups such as phenyl groups), and mixtures thereof and an $SiO_{4/2}$ unit (the molar ratio of the organopolysiloxane unit to the $SiO_{4/2}$ unit being from 0.08 to 2.0).

The amount of the organosiloxane unit contained in component (J) is an amount sufficient to hydrophobize the reinforcing silica, and the molar ratio of the organopolysiloxane unit to the $SiO_{4/2}$ unit is preferably within the range of from 0.08 to 2.0. This is because when the molar ratio is at least 0.08, the adhesive performance with respect to the LED chip is improved, and when the molar ratio is not more than 2.0, the reinforcing performance is remarkably improved. In addition, in order to increase the mechanical strength in the uncured and cured states, the BET method specific surface area must be at least 200 m$^2$/g, preferably at least 300 m$^2$/g, and more preferably at least 400 m$^2$/g.

Component (J) is produced by a method disclosed in Japanese Examined Patent Application Publication No. S61-56255 or U.S. Pat. No. 4,418,165. The compounded amount of component (J) is from 30 to 150 parts by mass and preferably from 50 to 100 parts by mass per 100 parts by mass of component (I).

An organohydrogenpolysiloxane for component (K) is a crosslinking agent of component (I) and is an organopolysiloxane having at least two silicon-bonded hydrogen atoms in a molecule. Examples of the molecular structure of component (K) include a straight chain structure, a partially branched straight chain structure, a branched chain structure, a cyclic structure, and a reticular structure. Examples of the bond positions of the silicon-bonded hydrogen atoms in component (K) are molecular chain terminals and/or molecular side chains. Examples of groups bonding to the silicon atoms other than hydrogen atoms in component (K) are substituted or unsubstituted monovalent hydrocarbon groups including alkyl groups such as methyl groups, ethyl groups, propyl groups, butyl groups, pentyl groups, hexyl groups, and heptyl groups; aryl groups such as phenyl groups, tolyl groups, xylyl groups, naphthyl groups, and anthracenyl group; aralkyl groups such as benzyl groups and phenetyl groups; and halogenated alkyl groups such as chloromethyl groups, 3-chloropropyl groups, and 3,3,3-trifluoropropyl groups. Examples of such an organohydrogenpolysiloxane include methylhydrogenpolysiloxanes capped at both molecular terminals with trimethylsiloxy groups, dimethylsiloxane-methylhydrogensiloxane copolymers capped at both molecular terminals with trimethylsiloxy groups, methylphenylsiloxane-methylhydrogensiloxane copolymers capped at both molecular terminals with dimethylphenylsiloxy groups, cyclic methylhydrogenpolysiloxanes, and copolymers comprising a dimethylhydrogensiloxane unit and an SiO$_{4/2}$ unit.

The compounded amount of component (K) is an amount sufficient to cure the composition. This amount is preferably an amount enabling silicon-bonded hydrogen atoms to be within the range of from 0.5 to 10 mol and more preferably within the range of from 1 to 3 mol per 1 mol of silicon-bonded alkenyl groups in the alkenyl group-containing raw organopolysiloxane rubber for component (I). This is because when the number of mols of silicon-bonded hydrogen atoms per 1 mol of silicon-bonded alkenyl groups is greater than or equal to the lower limit of this range in the composition described above, the curing of the composition is sufficient, and when the number of mols is less than or equal to the upper limit of this range, the heat resistance of the cured product of the composition is improved. Specifically, the amount is preferably from 0.1 to 10 parts by mass and more preferably from 0.3 to 5 parts by mass per 100 parts by mass of component (A).

A curing agent for component (L) is a catalyst or a reaction initiator for curing the composition, examples of which include platinum-based catalysts, organic peroxides, and mixtures of platinum-based catalysts and organic peroxides. Examples of the platinum-based catalysts include chloroplatinic acids, alcohol-denatured chloroplatinic acids, chelate compounds of platinum, coordination compounds of chloroplatinic acids and olefins, complexes of chloroplatinic acids and diketones, and complex compounds of chloroplatinic acids and divinyltetramethyldisiloxanes. Examples of the organic peroxides include benzoyl peroxide, t-butyl perbenzoate, o-methylbenzoyl peroxide, p-methylbenzoyl peroxide, m-methylbenzoyl peroxide, dicumyl peroxide, and 2,5-dimethyl-2,5-di(t-butyl peroxy)hexane.

The compounded amount of component (L) is an amount sufficient to cure the composition. When a platinum-based catalyst is used, the amount of platinum metal in the platinum-based catalyst is preferably in the range of from 0.1 to 500 ppm and more preferably in the range of from 1 to 100 ppm per 100 parts by mass of component (I). When an organic peroxide is used, the amount of the organic peroxide is preferably from 0.1 to 10 parts by mass per 100 parts by mass of component (I).

An adhesion promoter mainly comprising an organoalkoxysiloxane having organic functional groups such as mercapto groups, amino groups, vinyl groups, allyl groups, hexenyl groups, methacryloxy groups, acryloxy groups, and glycidoxy groups or a partially hydrolyzed condensate thereof may also be compounded as an additional component in order to improve adhesion. Examples of such an adhesion promoter include organoalkoxysilanes such as γ-mercaptopropyltrimethoxysilane, γ-mercaptopropylmethyldimethoxysilane, γ-(2-aminoethyl)aminopropyltrimethoxysilane, γ-methacryloxypropyltrimethoxysilane, γ-acryloxypropyltrimethoxysilane, vinyltri(methoxyethoxy)silane, allyltrimethoxysilane, and γ-glycidoxypropyltrimethoxysilane or partially hydrolyzed condensates thereof; reaction products of these organoalkoxysilanes and triallyl trimellitate or tetraallyl pyromellitate; reactants of alkoxysilanes and siloxane oligomers; and mixtures of these alkoxysilanes and reactive organic compounds such as allyl glycidyl ether, glycidyl acrylate, diallyl phthalate, trimethylol propane triacrylate, alkenyl carbonate group-containing compounds, and mercapto acetate group-containing compounds. Of these, γ-methacryloxypropyltrimethoxysilane, γ-glycidoxypropyltrimethoxysilane, mixtures thereof, or reaction mixtures thereof are preferably used. The content of this adhesion promoter is preferably from 0.1 to 10 parts by mass, more preferably from 0.3 to 5 parts by mass, per 100 parts by mass of the organopolysiloxane for component (I).

It is acceptable to add various known additives ordinarily added to silicone rubber compositions to the non-hot melt curable silicone composition to the extent that the object of the present invention is not impeded, examples thereof including another inorganic filler, a pigment, a heat resistance agent, and a cure retarder for a platinum-based catalyst. Examples of such additives include diatomaceous earth, quartz powder, calcium carbonate, transparent titanium oxide, and transparent red iron oxide. Examples of the heat resistant agents include rare earth oxides, cerium silanolate, and cerium fatty acid salts. Examples of the curing retardants include acetylene alcohol compounds such as 3-methyl-1-butyl-3-ol, 3,5-dimethyl-1-hexyn-3-ol, and phenylbutynol; enyne compounds such as 3-methyl-3-penten-1-yne and 3,5-dimethyl-3-hexen-1-yne; and other hydrazine compounds, phosphine compounds, mercaptan compounds, benzotriazoles, and methyl tris(methylisobutyloxy)silane.

The non-hot melt curable silicone composition may be cured to a B-stage state. There is no particular limitation upon the hardness of the composition; for example, a state in which the composition is incompletely cured, and swells due to the solvent but does not completely dissolve, yielding a state in which the composition has lost its fluidity, i.e., the B-stage (thermoset resin intermediate) defined in JIS K 6800.

The non-hot melt curable silicone composition is obtained by mixing and kneading the abovementioned components with a pair of rollers, a kneader, a Banbury mixer, or the like. Examples of methods for machining the obtained composition into a film shape include extruding the composition into a film shape through an extruder provided with a prescribed cap, sandwiching the composition between organic resin films such as polyolefin films or polyester films using a calender roll to form a uniform film shape, or molding the composition into a film shape with a press adjusted to not more than 40° C. In particular, continuously molding the composition by laminating the composition between organic resin films using a calender roll is effective from the perspective of production efficiency. A film-like silicone sealing material molded in this way can be used after being cut from a long roll into a required shape with a cutter or a perforator.

The other sheet may comprise at least one type of organopolysiloxane block copolymer.

The organopolysiloxane block copolymer preferably comprises:
from 40 to 90 mol % of a disiloxy unit represented by $[R^6_2SiO_{2/2}]$;
from 10 to 60 mol % of a trisiloxy unit represented by $[R^7SiO_{3/2}]$; and
from 0.5 to 2.5 mol % of a silanol group represented by $[\equiv SiOH]$;
each $R^6$ independently representing a $C_1$-$C_{30}$ hydrocarbon group;
each $R^7$ independently representing a $C_1$-$C_{20}$ hydrocarbon group;
the disiloxy unit $[R^6_2SiO_{2/2}]$ being present in a straight chain block comprising an average of from 10 to 400 disiloxy units $[R^6_2SiO_{2/2}]$;
the trisiloxy unit being present in a non-straight chain block having a molecular weight of at least 500 g/mol; and
each straight chain block being bonded to at least one non-straight chain block.

Examples of the hydrocarbon group include the monovalent hydrocarbon groups already described.

The organopolysiloxane block copolymer can have a molecular weight of at least 20,000 g/mol.

The layer comprising the organopolysiloxane block copolymer preferably has a refractive index of at least 1.5.

Examples of acceptable organopolysiloxane block copolymers include those disclosed in WO/2012/040457, WO/2012/040453, WO/2012/040367, WO/2012/040305, and WO/2012/040302, the contents of which are incorporated herein by reference.

The other sheet may be the single-layer compression molding or laminating sheet (hereafter, simply the "single-layer sheet") according to the present invention. In such cases, the laminate according to the present invention can be provided with two or more single-layer sheets. The single-layer sheets may have identical or different compositions.

The other sheet can comprise at least one type of inorganic particles and/or phosphor. The examples already described above can be used as the inorganic particles and/or phosphor. Thus, if the laminate is provided, for example, with two layers, one or both of the layers may comprise the inorganic particles and/or phosphor.

Figure 3:
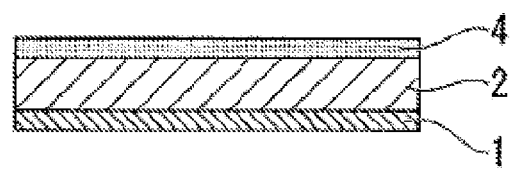
FIG. 3 is a schematic cross-sectional view of an example of a laminate for compression molding or laminating according to the present invention, in which two single-layer compression molding or laminating sheets 2, 4 are layered in that order upon a supporter sheet 1.

FIG. 3 is a schematic cross-sectional view of one example of a laminate in which a first single-layer sheet 2 and a second single-layer sheet 4 are layered in that order upon a supporter sheet 1. In the embodiment of the laminate shown in FIG. 3, one of the first single-layer sheet 2 and the second single-layer sheet 4 corresponds to the "other sheet" of the laminate. In the embodiment shown in FIG. 3, the first single-layer sheet 2 (hereafter, the "transparent layer") does not contain inorganic particles or a phosphor, but the second single-layer sheet 4 (hereafter collectively referred to as the "fluorescent layer") may contain inorganic particles and/or a phosphor. In the embodiment shown in FIG. 3, the fluorescent layer 4 preferably contacts the object of sealing.

Figure 4:
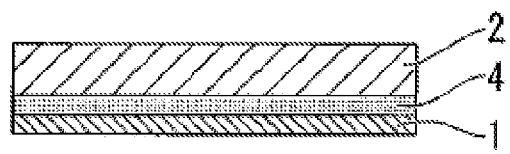
FIG. 4 is a schematic cross-sectional view of an example of a laminate for compression molding or laminating according to the present invention, in which two single-layer compression molding or laminating sheets 4, 2 are layered in that order upon a supporter sheet 1.

FIG. 4 is a schematic cross-sectional view of one example of a laminate in which a second single-layer sheet 4 and a first single-layer sheet 2 are layered in that order upon a supporter sheet 1. In the embodiment of the laminate shown in FIG. 4, one of the first single-layer sheet 2 and the second single-layer sheet 4 also corresponds to the "other sheet" of the laminate. Likewise, in the embodiment shown in FIG. 4, the first single-layer sheet 2 does not comprise inorganic particles or a phosphor, but the second single-layer sheet 4 does comprise inorganic particles and/or a phosphor. In the embodiment shown in FIG. 4, the transparent layer 2 preferably contacts the object of sealing.

Thus, the laminates according to the embodiments shown in FIGS. 3 and 4 are laminates, for use in compression molding or laminating, comprising a transparent layer 2 and a fluorescent layer 4.

If the laminate according to the embodiment shown in FIG. 3 or FIG. 4 is used, for example, to seal an LED, the transparent layer 2 and the fluorescent layer 4 can be integrally compression molded or laminated, thus allowing for precise control of the thickness of the fluorescent layer 4 and yielding good adherence between the transparent layer 2 and the fluorescent layer 4. Additionally, in the case of the laminate according to the embodiment shown in FIG. 3, it is not necessary, for example, to bond the phosphor to the LED in advance, and a hemi-spheroidal lens- or dome-shaped transparent seal can be formed on the fluorescent layer on the LED substrate. Meanwhile, in the case of the laminate according to the embodiment shown in FIG. 4, a hemi-spheroidal lens- or dome-shaped transparent seal on the surface of which a fluorescent layer is present can easily be manufactured.

In the laminates according to the embodiments shown in FIGS. 3 and 4, the fluorescent layer 4 may be homogenous, or may have a predetermined pattern formed therein. Thus, the laminates according to the embodiments shown in FIGS. 3 and 4 may also be laminates for use in compression molding or laminating comprising a transparent layer 2 and a patterned fluorescent layer 4. There is no particular limitation upon the type of pattern; it may consist of ridges and recessions in the through-thickness direction of the fluorescent layer 4, or of a pattern (rings, a lattice, zigzags) constituted by straight or curved lines, as appropriate, in the longitudinal and latitudinal directions on the surface of the fluorescent layer 4. Forming a pattern upon the fluorescent layer 4 in this way allows for the prevention of inorganic particles and/or phosphor being used where not necessary, and for reduced manufacturing costs.

The laminate shown in FIG. 3 can be manufactured by applying the composition according to the present invention to a supporter sheet 1, heating the sheet, for example, for a comparatively short time to cause partial crosslinking, further applying a mixture of the composition according to the present invention and one or more of the abovementioned inorganic particles and/or phosphors, as necessary, to the composition according to the present invention, and heating, for example, for a comparatively short time to cause partial crosslinking. The heating temperature is preferably from 50 to 200° C., more preferably from 80 to 150° C. The heating time is preferably from 1 to 20 minutes, more preferably from 5 to 15 minutes.

The laminate shown in FIG. 4 can be manufactured by applying the composition according to the present invention to a supporter sheet 1, heating the sheet, for example, for a comparatively short time to cause partial crosslinking, further applying a mixture of the composition according to the present invention and one or more of the abovementioned inorganic particles and/or phosphors, and heating, for example, for a comparatively short time to cause partial crosslinking. The heating temperature and heating time are as described above.

Figure 5:
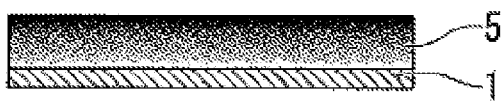
FIG. 5 is a schematic cross-sectional view of one example of a laminate for compression molding or laminating according to the present invention in which a single-layer sheet 5 whose refractive index varies in the through-thickness direction is layered upon a supporter sheet 1.

FIG. 5 is a schematic cross-sectional view of one example of a laminate in which a single-layer sheet 5 whose refractive index varies in the through-thickness direction is layered upon a supporter sheet 1. In the laminate according to the embodiment shown in FIG. 5, the refractive index of the single-layer sheet 5 varies in the through-thickness direction. Specifically, the refractive index increases as distance from the supporter sheet 1 increases. Thus, the laminate according to the embodiment shown in FIG. 5 is a laminate for use in compression molding or laminating provided with a single-layer sheet 5 whose front and rear surfaces have different refractive indexes. In the embodiment shown in FIG. 5, the single-layer sheet 5 preferably contacts the object of sealing.

Figure 6:
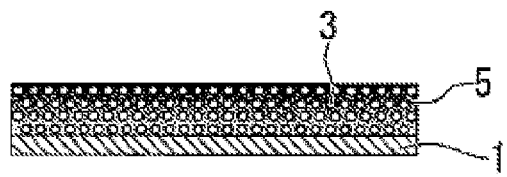
FIG. 6 is a schematic cross-sectional view of one example of a laminate for compression molding or laminating according to the present invention in which a single-layer sheet 5 comprising a phosphor 3 is layered upon a supporter sheet 1.

FIG. 6 is a schematic cross-sectional view of one example of a laminate in which a single-layer sheet 5 comprising inorganic particles and/or a phosphor 3 is layered upon the supporter sheet 1. The size of the inorganic particles or phosphor 3 has been magnified. The refractive index of the single-layer sheet 5 increases as distance from the supporter sheet 1 increases. In the embodiment shown in FIG. 6 as well, the single-layer sheet 5 preferably contacts the object of sealing.

If the laminates according to the embodiments shown in FIGS. 5 and 6 are used, for example, to seal an LED, the seal near the LED will have a higher refractive index, and the seal near the surface will have a low refractive index, yielding an LED with a superior light output efficiency.

The laminates according the embodiments shown in FIGS. 5 and 6 can be manufactured by a step of applying a comparatively thin layer of a mixture of the composition according to the present invention and one or more of the abovementioned inorganic particles and/or phosphors as necessary to a supporter sheet 1 and heating, for example, for a comparatively short time to cause partial crosslinking. This step is then repeated, using a modified composition, to form a single-layer sheet 5. The heating temperature is preferably from 50 to 200° C., more preferably from 80 to 150° C. The heating time is preferably from 10 seconds to 5 minutes, more preferably from 30 seconds to 3 minutes. There is no particular limitation to the changes made to the composition as long as it is in the direction in which the refractive index increases; for example, the phenyl group content of a phenyl group-containing organopolysiloxane can be increased. In such cases, the change in refractive index within the single-layer sheet 5 can be roughly continuous. It is also possible to vary the degree of inorganic particles settling within the sheet when forming the sheet to obtain a roughly continuous change in refractive index. The sheet according to the present invention can be produced via coating, molding, printing, or the like.

Meanwhile, it is also possible to use a laminate of multiple subsheets instead of the single-layer sheet 5. In such cases, the subsheets may be layered so that their refractive indices increase as distance from the supporter sheet 1 increases. Such subsheets can be obtained by applying a comparatively thick layer of a mixture of the composition according to the present invention and one or more of the abovementioned inorganic particles and/or phosphors as necessary and slightly increasing the abovementioned heating time. In such cases, the change in refractive index within the laminate may be discontinuous.

Figure 7:
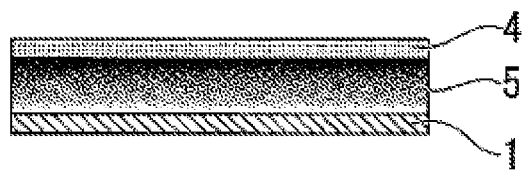
FIG. 7 is a schematic cross-sectional view of an example of the embodiment shown in FIG. 5 to which a fluorescent layer 4 has been further added.
Figure 8:
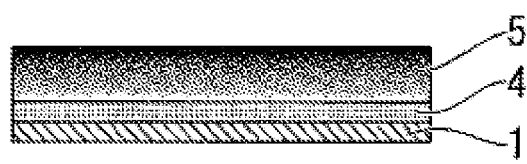
FIG. 8 is a schematic cross-sectional view of another example of the embodiment shown in FIG. 5 to which a fluorescent layer 4 has been further added.

FIGS. 7 and 8 are schematic cross-sectional views of an example of the embodiment shown in FIG. 5 to which a fluorescent layer 4 has been further added. The laminate according to the embodiment shown in FIGS. 7 and 8 respectively can be obtained by adding steps of forming a fluorescent layer 4 (single-layer sheet comprising inorganic particles and/or a phosphor) before and after manufacturing the laminate according to the embodiment shown in FIG. 5.

Figure 9:
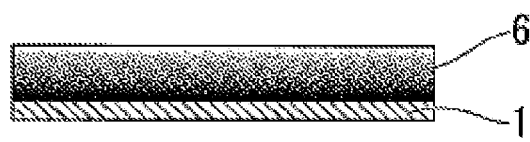
FIG. 9 is a schematic cross-sectional view of one example of a laminate for compression molding or laminating according to the present invention in which a single-layer sheet 6 whose post-curing hardness and/or refractive index varies in the through-thickness direction is layered upon a supporter sheet 1.

FIG. 9 is a schematic cross-sectional view of one example of a laminate in which a single-layer sheet 6, in which the hardness of the cured product varies in the through-thickness direction, is layered upon a supporter sheet 1. In the laminate according to the embodiment shown in FIG. 9, the hardness of the cured single-layer sheet 6 varies in the through-thickness direction. Specifically, the hardness of the cured product decreases as distance from the supporter sheet 1 increases. Thus, the laminate according to the embodiment shown in FIG. 9 is a laminate for use in compression molding or laminating provided with a single-layer sheet 6 whose front and rear surfaces have different post-curing hardnesses. In the embodiment shown in FIG. 9, the single-layer sheet 6 preferably contacts the object of sealing.

If the laminate according to the embodiment shown in FIG. 9 is used, for example, to seal an LED or the like, the seal near the LED has a low post-curing hardness, and the surface of the seal has a high hardness, thus yielding a sealed LED or the like of superior long-term reliability, allowing for the prevention or reduction of wire breakage or peeling of sealing material from the surface of the LED, and simultaneously allowing the surface tack properties of the sealing material to be improved.

Generally, a hard seal is weak against heat stress, and exhibits problems such as wire breakage or peeling of the seal from the surface of the wire or LED chip with extended usage; however, because the inner side of a seal contacting an LED or the like can be rendered comparatively soft in the seal constituted by the laminate shown in FIG. 9, these problems can be resolved. The hot-melt curable silicone composition for compression molding or laminating according to the present invention can also favorably be used with an LED having a flip chip or other wireless structure.

Meanwhile, increasing the hardness of the outer side of the seal allows impact-induced damage, dust adhesion, and the like to be prevented or reduced, and gas permeability to be suppressed.

The laminates according the embodiments shown in FIG. 9 can be manufactured by a step of applying a comparatively thin layer of a mixture of the composition according to the present invention and one or more of the abovementioned inorganic particles and/or phosphors as necessary to a supporter sheet 1 and heating, for example, for a comparatively short time to cause partial crosslinking. This step is then repeated, using a modified composition, to form a single-layer sheet 6. The heating temperature is preferably from 50 to 200° C., more preferably from 80 to 150° C. The heating time is preferably from 10 seconds to 5 minutes, more preferably from 30 seconds to 3 minutes. There is no particular limitation upon the change in the composition as long as it is in the direction in which hardness decreases; for example, the amount of alkenyl groups and/or silicon atom-bonded hydrogen atoms in the phenyl group-containing organopolysiloxane can be reduced. In such cases, the change in hardness within the cured single-layer sheet 6 can be roughly continuous.

Meanwhile, it is also possible to use a laminate of multiple subsheets instead of the single-layer sheet 6. In such cases, the subsheets are layered so that the hardness of the cured subsheets decreases as distance from the supporter sheet 1. Such subsheets can be obtained by applying a comparatively thick layer of a mixture of the composition according to the present invention and one or more of the abovementioned inorganic particles and/or phosphors as necessary and slightly increasing the abovementioned heating time. In such cases, the change in hardness within the cured laminate may be discontinuous.

Figure 10:
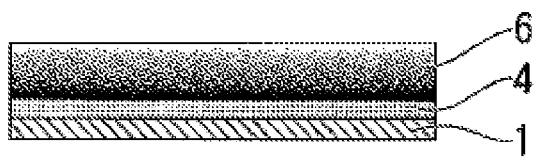
FIG. 10 is a schematic cross-sectional view of an example of the embodiment shown in FIG. 9 to which a fluorescent layer 4 has been further added.

FIG. 10 is a schematic cross-sectional view of an example of the embodiment shown in FIG. 9 to which a fluorescent layer 4 has been further added. The laminate according to the embodiment shown in FIG. 10 can be obtained by adding a step of forming a fluorescent layer 4 (single-layer sheet comprising inorganic particles and/or a phosphor) upon the supporter sheet 1 before manufacturing the laminate according to the embodiment shown in FIG. 9.

Apart from the embodiments shown in FIGS. 5 to 10, a configuration in which the composition of the sheet comprising the composition according to the present invention varies continuously or discontinuously in the through-thickness direction of the sheet, yielding a sheet whose front and rear surfaces have different physical properties, is also acceptable. The variation in composition can be effected by, for example, causing at least one physical property selected from the molecular structures, molecular weights, or amounts included of components (A) through (H), and the molar ratios of silicon atom-bonded hydrogen atoms and silicon atom-bonded alkenyl groups to vary in the through-thickness direction of the sheet.

It is thus possible, in the laminate according to the present invention, for each of the layers to differ from each other in terms of at least one physical property selected from the group consisting of refractive index, hardness, light transmission rate, water vapor transmission rate, thermal conductivity, thermal expansion, surface tack, elastic modulus, and curing rate.

At least one layer constituting the laminate according to the present invention may have a predetermined pattern. There is no particular limitation upon the type of pattern; it may consist of ridges and recessions in the through-thickness direction of the layer, or of a pattern (rings, a lattice, zigzags) constituted by straight or curved lines, as appropriate, in the longitudinal and latitudinal directions on the surface of the layer.

The laminate according to the present invention may also be rough-surfaced. There is no particular limitation upon the type of roughness; for example, unevenness of predetermined depths and heights can be formed in the surface. The unevenness can be formed by, for example, by placing a hard object of metal or the like having unevenness of a predetermined shape upon the surface of the laminate according to the present invention, and heating the laminate according to the present invention and/or the hard object to transfer the shape.

Figure 11:
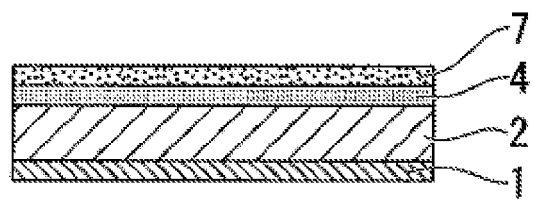
FIG. 11 is a schematic cross-sectional view of an example of the embodiment shown in FIG. 3 to which another fluorescent layer 7 has been further added.

FIG. 11 is a schematic cross-sectional view of another example of the embodiment shown in FIG. 3 to which a fluorescent layer 7 has been further added. Thus, the laminate according to the embodiment shown in FIG. 11 is a laminate for use in compression molding or laminating comprising a plurality of different fluorescent layers. The laminate according to the embodiment shown in FIG. 11 can be obtained by adding a step of forming a fluorescent layer 7 (single-layer sheet comprising other inorganic particles and/or another phosphor) upon the fluorescent layer 4 after manufacturing the laminate according to the embodiment shown in FIG. 3.

In the laminate according to the embodiment shown in FIG. 11, the fluorescent layer 4 and the fluorescent layer 7 comprise different types of phosphors. For example, it is possible to use a yellow-luminescent phosphor that emits yellow light in the fluorescent layer 4, and a red-luminescent phosphor that emits red light in the fluorescent layer 7. By combining a plurality of colors in this way, the color of the emitted light can be more easily adjusted, and color reproducibility can be increased. In addition, there is no mixing of phosphors even if the fluorescent layer 4 and the fluorescent layer 7 come into contact, unlike cases in which a plurality of different types of liquid comprising different types of phosphors is applied. In cases in which blue light is emitted by an LED, the action of the fluorescent layer 4 converts the blue light to white light, allowing blue light-induced damage to the red phosphor of the fluorescent layer 7 to be reduced. It is also possible, for example, to remove the layer containing the red phosphor from the LED and adopt a structure in which a layer containing a yellow or green phosphor contacts the LED, thereby suppressing absorption of yellow or green light by the red phosphor.

In this way, the laminate according to the present invention can include at least two layers comprising different types of phosphors. The phosphor is preferably selected from the group consisting of yellow-luminescent phosphors, red-luminescent phosphors, green-luminescent phosphors, and mixtures thereof.

The present invention also relates to a semiconductor device provided with the cured composition, single-layer sheet for compression molding or laminating, or laminate, the cured product containing a semiconductor element. The cured product can function as a seal for the semiconductor element. Specifically, the present invention also relates to a semiconductor device sealed using the composition or laminate according to the present invention.

Examples of semiconductor elements include silicon semiconductors, gallium phosphide semiconductors, gallium arsenide semiconductors, gallium nitride semiconductors, and the like. The cured product exhibits superior initial bondability and bonding durability with respect to these, and especially superior bonding durability when subjected to heating/cooling cycles.

The semiconductor element may be an optical semiconductor element. Specific examples of the optical semiconductor element include light-emitting diodes (LEDs), semiconductor lasers, photodiodes, phototransistors, solid-state image sensing devices, and light emitters and receivers for photocouplers; the optical semiconductor element is preferably a light-emitting diode (LED).

The sealed semiconductor device according to the present invention can be manufactured via a step of using the composition, single-layer sheet for compression molding or laminating, or laminate according to the present invention to perform compression molding or laminating. For example, the device can be manufactured via a step of disposing the composition, single-layer sheet for compression molding or laminating, or laminate according to the present invention so that the composition or single-layer sheet for compression molding or laminating according to the present invention faces the semiconductor element and performing compression molding or laminating. Alternatively, a semiconductor element can be laminated, as necessary, using the composition, single-layer sheet for compression molding or laminating, or laminate according to the present invention so that the composition or single-layer sheet for compression molding or laminating according to the present invention faces the semiconductor element, after which a mold having a cavity of a predetermined shape is used to perform compression molding.

An example of a process of manufacturing a semiconductor device according to the present invention will be described hereafter with reference to the drawings.

Figure 12:
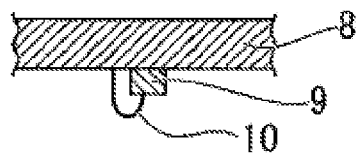
FIG. 12 is a schematic cross-sectional view of an example of an object of sealing using the composition, single-layer sheet for compression molding or laminating, or laminate according to the present invention.

FIG. 12 is a schematic cross-sectional view of an example of an object of sealing of the present invention, and shows an optical device prior to sealing in which an LED chip 9 is mounted onto a substrate 8 using a die-bonding agent or the like, the LED chip 9 and a circuit or external lead (not shown) on the surface of the substrate 8 being connected by a wire 10.

There is no particular limitation upon the substrate used in the present invention as long as it is heat-resistant; examples of substrate materials include: metals such as silver, gold, copper, aluminum, and nickel; semiconductors such as silicon; glasses such as heat-resistant glass; high melting point thermoplastic resins; thermoset resins such as epoxy resins, BT resins, polyimide resins, and silicone resins; ceramic such as alumina and alumina nitride; and composites thereof.

Figure 13:
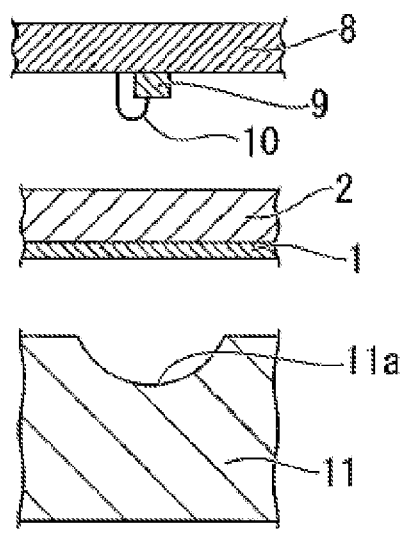
FIG. 13 is a schematic cross-sectional view of a state prior to compression molding in a sealing process performed using the laminate for compression molding or laminating according to the present invention.

First, as shown in FIG. 13, the substrate 8 onto which the LED chip 9 is mounted is aligned with a recessed cavity 11a of a mold 11 of a compression molding device. Next, a laminate for use in compression molding or laminating according to the present invention according to the embodiment shown in FIG. 1, the laminate being constituted by a supporter sheet 1 and an optically transparent single-layer sheet 2, is disposed so that the single-layer sheet 2 faces the LED chip 9. In FIG. 13, there is a gap between the laminate for use in compression molding or laminating according to the present invention and the LED chip 9 for convenience of illustration, but the laminate for use in compression molding or laminating according to the present invention may also be placed directly upon the LED chip 9. If performing compression molding or laminating upon the single layer or laminate for compression molding or laminating according to the present invention, a release film for preventing adhesion of the composition between the machining device and the composition according to the present invention may be provided.

It is also possible to laminate the LED chip 9 side of the substrate 8 using the laminate for use in compression molding or laminating according to the present invention in advance via vacuum lamination, or the like, to integrate the two.

Figure 14:
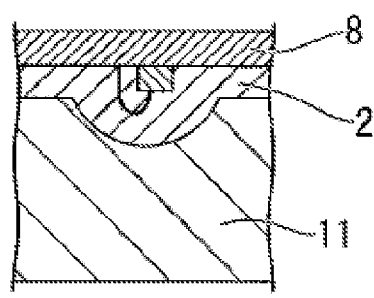
FIG. 14 is a schematic cross-sectional view of a state during compression molding in a sealing process performed using the laminate for compression molding or laminating according to the present invention.

Next, after peeling and removing the laminate for compression molding or laminating according to the present invention from the supporter sheet 1, the mold 11 is pressed onto the substrate 8 at a predetermined pressure to perform compression molding on the single-layer sheet 2, as shown in FIG. 14. The single-layer sheet 2 is thereby heated and melted, filling the cavity 11a with the LED chip 9 in an enveloped state, and forming a hemi-spheroidal lens- or dome-shaped seal. Next, the seal is cured by heat to form a cured product. In the present invention, the single-layer sheet 2 is melted and liquefied via heating, allowing even a complex structural semiconductor element having the wire 10 to be completely filled, and avoiding breakage or the like of the wire 10. The compression force and time of the mold 11 can be set, as appropriate, according to the type of substrate 8, LED chip 9, and laminate used; for example, the force can be from 0.01 to 100 kgf/cm$^2$, preferably from 0.1 to 10 kgf/cm$^2$, and the time can be from 3 to 30 minutes, preferably from 5 to 15 minutes. The compression molding temperature can also be set, as appropriate, according to the type of substrate 8, LED chip 9, and laminate used; for example, the temperature can be from 50 to 200° C., preferably from 100 to 150° C.

Figure 15:
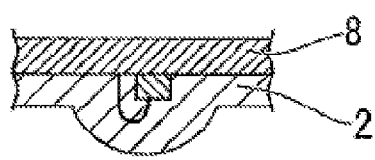
FIG. 15 is a schematic cross-sectional view of a state after compression molding in a sealing process performed using the laminate for compression molding or laminating according to the present invention.

By finishing the compression of the substrate 8 by the mold 11 and separating the mold 11 from the substrate 8, the cured seal 2 can be removed from the cavity 11a to obtain an optical device in which an LED chip is sealed in the state shown in FIG. 15. In this example, an optically transparent single-layer sheet 2 is used, allowing an optically transparent seal 2 to be obtained.

In the example shown in FIG. 15, the cavity 11a has a hemispheroidal shape, with the result that the seal 2 also has a hemi-spheroidal lens or dome shape. It is thus possible to control the direction of light projection from the LED chip 9 and to keep head-on brightness from becoming too great, thereby allowing for superior optical properties. The contact angle of the seal 2 and the substrate 8 is preferably at least 60°, more preferably at least 70°, still more preferably at least 80°, and especially preferably from 85 to 90°.

However, it is possible, as necessary, for the seal 2 to have a Fresnel shape, a concave lens shape, a convex lens or dome shape other than a hemi-spheroidal lens or dome, a shape having unevenness in its surface, a flat shape, or another desired shape. These shapes can be formed via a desired shape in the cavity of the compression molding device or roller or pressing surface of the laminator. A layer of the composition according to the present invention may also optionally be present between the lens shape or other shape of the seal 2 and the LED substrate.

Secondary curing (post-curing) may optionally be performed, as necessary, upon the seal 2 so obtained at, for example, a temperature of from 100 to 200° C., preferably from 140 to 180° C.

In the example described above, a laminate for compression molding or laminating according to the present invention according to the embodiment shown in FIG. 1 was used, but a laminate for compression molding or laminating according to the present invention according to the other embodiments shown in FIGS. 2 to 11 can also be used in a similar manner.

Figure 16:
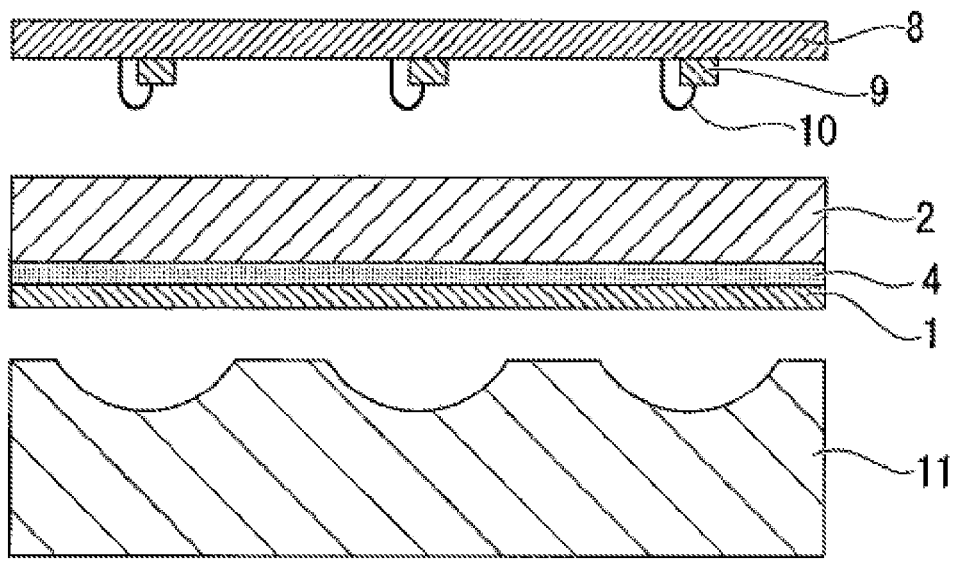
FIG. 16 is a schematic cross-sectional view of a manufacturing example of a semiconductor device using the laminate for compression molding or laminating according to the present invention shown in FIG. 4.
Figure 17:
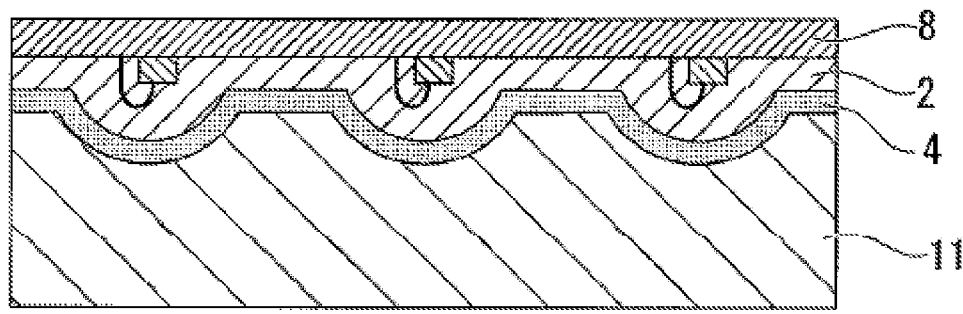
FIG. 17 is a schematic cross-sectional view of a manufacturing example of a semiconductor device using the laminate for compression molding or laminating according to the present invention shown in FIG. 4.

FIGS. 16 and 17 are schematic cross-sectional views of a manufacturing example of a semiconductor device using the laminate for compression molding or laminating according to the present invention shown in FIG. 4.

First, as shown in FIG. 16, the substrate 8 onto which the LED chip 9 is mounted, and which is electrically connected by the wire 10 to a circuit omitted from the drawings, is aligned with a recessed cavity of a mold 11 of a compression molding device. Next, a laminate for compression molding or laminating according to the present invention according to the embodiment shown in FIG. 4, the laminate being constituted by a supporter sheet 1, a fluorescent layer 4, and an optically transparent single-layer sheet 2, is disposed so that the single-layer sheet 2 faces the LED chip 9. In FIG. 16, there is a gap between the laminate for compression molding or laminating according to the present invention and the LED chip 9 for convenience of illustration, but the laminate for compression molding or laminating according to the present invention may also be placed directly upon the LED chip 9.

It is also possible to laminate the LED chip 9 side of the substrate 8 using the laminate for compression molding or laminating according to the present invention in advance via vacuum lamination, or the like, to integrate the two.

Next, after peeling and removing the laminate for compression molding or laminating according to the present invention from the supporter sheet 1, the mold 11 is pressed onto the substrate 8 at a predetermined pressure to perform compression molding on the single-layer sheet 2 and the fluorescent layer 4, as shown in FIG. 17. The single-layer sheet 2 and the fluorescent layer 4 are thereby heated and melted, filling the interior of the cavity with the LED chip 9 in an enveloped state, and forming a hemi-spheroidal lens- or dome-shaped seal. Next, the seal is cured by heat to form a cured product. In the present invention, the single-layer sheet 2 and the fluorescent layer 4 are melted, softened, and liquefied via heating, allowing even a complex structural semiconductor element having the wire 10 to be completely filled, and avoiding breakage, or the like, of the wire 10. The compression force and temperature of the mold 11 can be set, as appropriate, according to the type of substrate 8, LED chip 9, and laminate used.

Figure 18:
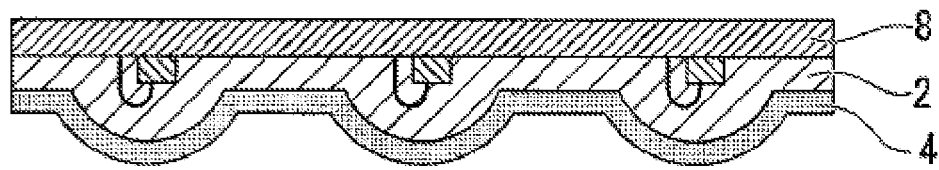
FIG. 18 is a schematic cross-sectional view of a manufacturing example of a semiconductor device using the laminate for compression molding or laminating according to the present invention shown in FIG. 4.

By finishing the compression of the substrate 8 by the mold 11 and separating the mold 11 from the substrate 8, the cured seal 2 can be removed from the cavity to obtain an optical device in which an LED chip 9 is sealed in the state shown in FIG. 18. In this example, a laminate comprising an optically transparent single-layer sheet 2 and a fluorescent layer 4 is used, allowing an optical device in which the fluorescent layer 4 is provided on the surface of the optically transparent seal 2 to be obtained.

In the embodiments shown in FIGS. 12 to 18, the size of the the the single-layer sheet for use in compression molding or laminating according to the present invention is preferably less than the size of the substrate 8. Here, "size" generally refers to "area". This allows for the prevention or reduction of resin leakage from the cavity during compression molding.

Additionally, in the embodiments shown in FIGS. 12 to 18, the thickness of the single-layer sheet for compression molding or laminating according to the present invention is preferably less than the maximum height of the cavity of the mold 11. This allows for the prevention or reduction of resin leakage from the cavity during compression molding, and for the amount of sheet used to be suppressed.

Moreover, in the embodiments shown in FIGS. 12 to 18, the size of the supporter sheet 1 of the laminate for compression molding or laminating according to the present invention may be greater than the size of the single-layer sheet 2 and/or the fluorescent layer 4. This obviates the need for a treatment, such as applying a release agent, to be performed on the entire surface of the supporter sheet 1, allowing manufacturing costs to be reduced.

EXAMPLES

The present invention will be described below using examples, but the present invention is not limited thereto.

Practical Example 1

75 parts by mass of a methylvinylpolysiloxane represented by the average unit formula: $(MeViSiO_{2/2})_{0.25}(Ph_2SiO_{2/2})_{0.3}(PhSiO_{3/2})_{0.45}$, 25 parts by mass of a trisiloxane represented by the formula: $(HMe_2SiO)_2SiPh_2$, 10 parts by mass of a methylphenylpolysiloxane represented by $ViMe_2SiO(MePhSiO)_{17.5}SiViMe_2$, a 1,3-divinyl-1,1,3,3-tetramethyldisiloxane solution of platinum-1,3-divinyl-1,1,3,3-tetramethyldisiloxane (in an amount such that there were 40 ppm in terms of mass of metallic platinum with respect to the total amount of the composition), and ethyny hexanol (in an amount equivalent to 600 ppm in terms of mass with respect to the total amount of the composition) were added and mixed to homogeneity to prepare a liquid hydrosilylation curable silicone composition 1 having a viscosity at 25° C. of 8,630 mPa·s. The obtained silicone composition 1 was poured into a 1 cm-thick mold, heated in a press at 100° C. for 30 minutes, and cooled, after which measurement of type A hardness at 25° C. yielded a result of 68. The obtained silicone composition 1 was also heated in a hot press at 100° C. for 30 minutes to obtain a 1 mm-thick transparent sheet 1. Measurement of the minimum torque value of the transparent sheet 1 at 130° C. using a moving die rheometer (MDR) yielded a result of 0.01 dN·m.

Practical Example 2

37.5 parts by mass of a methylvinylpolysiloxane represented by the average unit formula: $(MeViSiO_{2/2})_{0.25}(Ph_2SiO_{2/2})_{0.3}(PhSiO_{3/2})_{0.45}$, 40 parts by mass of a methylvinylphenylpolysiloxane represented by $(Me_2ViSiO_{3/2})_{0.2}(PhSiO_{3/2})_{0.8}$, 22.5 parts by mass of a trisiloxane represented by the formula: $(HMe_2SiO)_2SiPh_2$, 10 parts by mass of a methylphenylpolysiloxane represented by $ViMe_2SiO(MePhSiO)_{17.5}SiViMe_2$, a 1,3-divinyl-1,1,3,3-tetramethyldisiloxane solution of platinum-1,3-divinyl-1,1,3,3-tetramethyldisiloxane (in an amount such that there were 40 ppm in terms of mass of metallic platinum with respect to the total amount of the composition), and ethynyl hexanol (in an amount equivalent to 600 ppm in terms of mass with respect to the total amount of the composition) were added and mixed to homogeneity to prepare a liquid hydrosilylation curable silicone composition 2 having a viscosity at 25° C. of 17,090 mPa·s. The obtained silicone composition 2 was poured into a 1 cm-thick mold, heated in a press at 100° C. for 15 minutes, and cooled, after which measurement of type A hardness at 25° C. yielded a result of 55. The obtained silicone composition 2 was also heated in a hot press at 100° C. for 30 minutes to obtain a 1 mm-thick transparent sheet 2. Measurement of the minimum torque value of the transparent sheet 2 at 130° C. using a moving die rheometer (MDR) yielded a result of 0.02 dN·m.

Practical Example 3

A transparent sheet 1 was set, along with an LED retainer board electrically connected via wire bonding, at a position on a compression molding device provided with a mold having a dome-shaped cavity corresponding to the cavity. Next, compression molding was performed at 130° C. for five minutes, and the sheet was melted and cured to seal the LED, thus obtaining an LED device comprising a dome-shaped transparent seal, the device having a cross-sectional shape like that shown in FIG. 15.

Practical Example 4

A transparent sheet 2 was set, along with an LED retainer board electrically connected via wire bonding, at a position on a compression molding device provided with a mold having a dome-shaped cavity corresponding to the cavity. Next, compression molding was performed at 130° C. for five minutes, the sheet was melted and cured to seal the LED, and heating was further performed at 150° C. for one hour, thus obtaining an LED device comprising a dome-shaped transparent seal, the device having a cross-sectional shape like that shown in FIG. 15.

Practical Example 5

A yellow YAG phosphor (NYAG4454, Intematix) was mixed with the liquid hydrosilylation curable silicone composition 1 prepared in Practical Example 1 to a concentration of 5 mass % with respect to the total mass of the composition to obtain a yellow phosphor-containing liquid silicone composition. The yellow phosphor-containing liquid silicone composition so obtained was heated in a hot press at 110° C. for 15 minutes to obtain a 1 mm-thick phosphor sheet 1. The obtained phosphor sheet 1 was set, along with an LED retainer board electrically connected via wire bonding, at a position on a compression molding device provided with a mold having a dome-shaped cavity corresponding to the cavity. Next, compression molding was performed at 130° C. for five minutes, the sheet was melted and cured to seal the LED, and heating was further performed at 150° C. for one hour, thus obtaining an LED device comprising a dome-shaped yellow phosphor sealed molded product, the device having a cross-sectional shape like that shown in FIG. 15.

Practical Example 6

A yellow YAG phosphor (NYAG4454, Intematix) was mixed with the liquid hydrosilylation curable silicone composition 1 prepared in Practical Example 1 to a concentration of 8 mass % with respect to the total mass of the composition to obtain a yellow phosphor-containing liquid silicone composition. The yellow phosphor-containing liquid silicone composition so obtained was heated in a hot press at 120° C. for 15 minutes to obtain a 300 μm-thick phosphor sheet 2. The obtained phosphor sheet 2 was laminated onto the 1 mm-thick transparent sheet 1 prepared in Practical Example 1 to obtain a laminated sheet 1.

Practical Example 7

A yellow YAG phosphor (NYAG4454, Intematix) was mixed with the liquid hydrosilylation curable silicone composition 1 prepared in Practical Example 1 to a concentration of 50 mass % with respect to the total mass of the composition to obtain a yellow phosphor-containing liquid silicone composition. The yellow phosphor-containing liquid silicone composition so obtained was heated in a hot press at 120° C. for 15 minutes to obtain a 60 μm-thick phosphor sheet 3. The obtained phosphor sheet 3 was laminated onto the 1 mm-thick transparent sheet 1 prepared in Practical Example 1 to obtain a laminated sheet 2.

Practical Example 8

Figure 19:
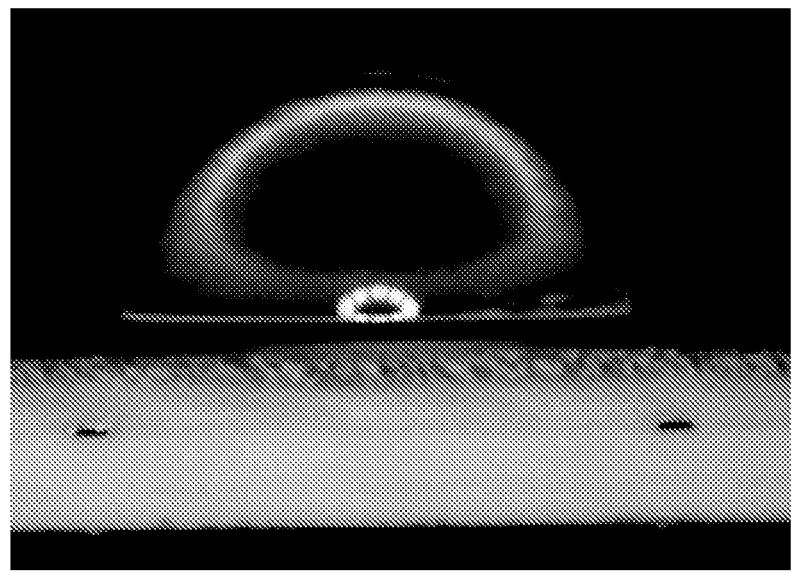
FIG. 19 is a cross-sectional photograph of an LED device obtained in Practical Example 8.

An LED retainer board electrically connected via wire bonding was set at a position on a compression molding device provided with a mold having a dome-shaped cavity corresponding to the cavity. The laminated sheet 1 was then supplied to the position corresponding to the cavity so that the phosphor sheet 2 faced the LED. Next, compression molding was performed at 130° C. for five minutes, the laminated sheet 1 was melted and cured to seal the LED, and heating was further performed at 150° C. for one hour, thus obtaining an LED device comprising a dome-shaped transparent seal. It was confirmed that the fluorescent layer derived from the phosphor sheet 2 covered the LED and electrode without any void spaces, and a dome-shaped transparent seal derived from the transparent sheet 1 was formed upon the fluorescent layer, as shown in FIG. 19. Optical microscope observation of the cross section of the LED device near the sealed LED did not reveal any mixing of phosphor between the transparent seal and the fluorescent layer.

Practical Example 9

Figure 20:
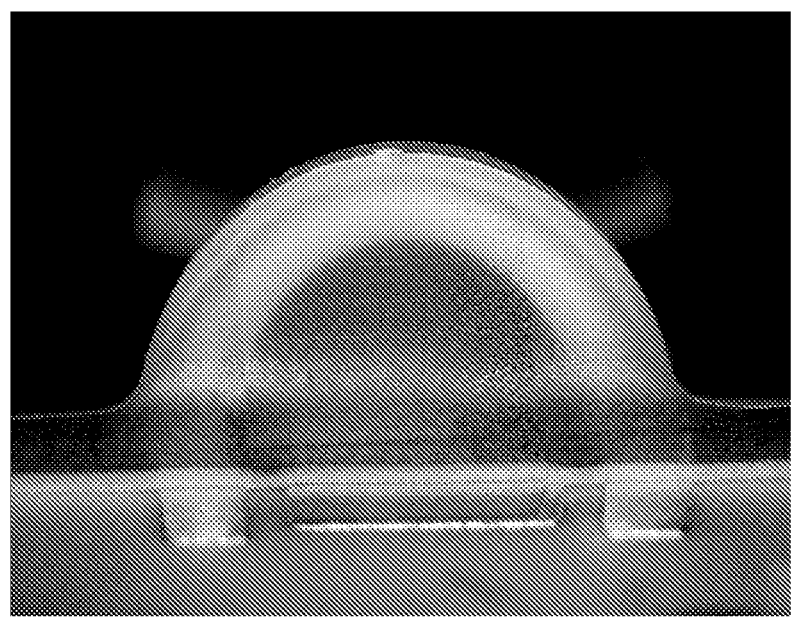
FIG. 20 is a cross-sectional photograph of an LED device obtained in Practical Example 9.

An LED retainer board electrically connected via wire bonding was set at a position on a compression molding device provided with a mold having a dome-shaped cavity corresponding to the cavity. The laminated sheet 2 was then supplied to the position corresponding to the cavity so that the phosphor sheet 3 faced the LED. Next, compression molding was performed at 130° C. for five minutes, the laminated sheet 2 was melted and cured to seal the LED, and heating was further performed at 150° C. for one hour, thus obtaining an LED device comprising a dome-shaped transparent seal. It was confirmed that the fluorescent layer derived from the phosphor sheet 3 covered the LED and electrode without any void spaces, and a dome-shaped transparent seal derived from the transparent sheet 2 was formed upon the fluorescent layer. Optical microscope observation of the cross-section of the LED device near the sealed LED did not show any mixing of phosphor between the transparent seal and the fluorescent layer, as shown in FIG. 20.

Practical Example 10

The operations of Practical Example 8 were repeated to obtain an LED device comprising a dome-shaped seal, except that the laminated sheet 1 prepared in Practical Example 6 was supplied to the cavity-corresponding position so that the phosphor sheet 2 faced the side opposite the LED. It was confirmed that the dome-shaped transparent seal and transparent layer derived from the transparent sheet 1 covered the LED and electrode without any void spaces, and the surfaces of the transparent seal and transparent layer were covered by a fluorescent layer derived from the phosphor sheet 2, as shown in FIG. 18. Optical microscope observation of the cross-section of the LED device near the sealed LED did not show any mixing of phosphor between the transparent seal and transparent layer and the fluorescent layer.

Practical Example 11

The operations of Practical Example 9 were repeated to obtain an LED device comprising a dome-shaped seal, except that the laminated sheet 2 prepared in Practical Example 7 was supplied to the cavity-corresponding position so that the phosphor sheet 3 faced the side opposite the LED. It was confirmed that the dome-shaped transparent seal and transparent layer derived from the transparent sheet 1 covered the LED and electrode without any void spaces, and the surfaces of the transparent seal and transparent layer were covered by a fluorescent layer derived from the phosphor sheet 3, as shown in FIG. 18. Optical microscope observation of the cross-section of the LED device near the sealed LED did not show any mixing of phosphor between the transparent seal and transparent layer and the fluorescent layer.

Practical Example 12

A silicate green phosphor (EG3261, Intematix) was mixed with the liquid hydrosilylation curable silicone composition 2 prepared in Practical Example 2 to a concentration of 40 mass % with respect to the total mass of the composition to obtain a green phosphor-containing liquid silicone composition. The green phosphor-containing liquid silicone composition so obtained was heated in a hot press at 110° C. for 15 minutes to obtain a 60 μm-thick green phosphor sheet.

Meanwhile, a nitride red phosphor (R6535, Intematix) was mixed with the liquid hydrosilylation curable silicone composition 2 prepared in Practical Example 2 to a concentration of 10 mass % with respect to the total mass of the composition to obtain a red phosphor-containing liquid silicone composition. The red phosphor-containing liquid silicone composition so obtained was heated in a hot press at 110° C. for 15 minutes to obtain a 60 μm-thick red phosphor sheet.

The obtained red phosphor sheet was laminated onto the 1 mm-thick transparent sheet 2 obtained in Practical Example 4, and the obtained green phosphor sheet was laminated onto the red phosphor sheet to obtain a laminated sheet 3.

The obtained laminated sheet 3 was set, along with an LED retainer board electrically connected via wire bonding, at a position on a compression molding device provided with a mold having a dome-shaped cavity corresponding to the cavity so that the green phosphor sheet faced the side opposite the LED. Next, compression molding was performed at 130° C. for five minutes, the sheet was melted and cured to seal the LED, and heating was further performed at 150° C. for one hour, thus obtaining an LED device comprising a dome-shaped seal. It was confirmed that the dome-shaped transparent seal and transparent layer derived from the transparent sheet 2 covered the LED and electrode without any void spaces, and that the surface of the dome was covered by the red and green phosphor sheet layers. Optical microscope observation of the cross-section of the LED device near the sealed LED did not show any mixing of phosphor between the transparent seal, transparent layer, green phosphor sheet, and red phosphor sheet.

Practical Example 13

Figure 21:
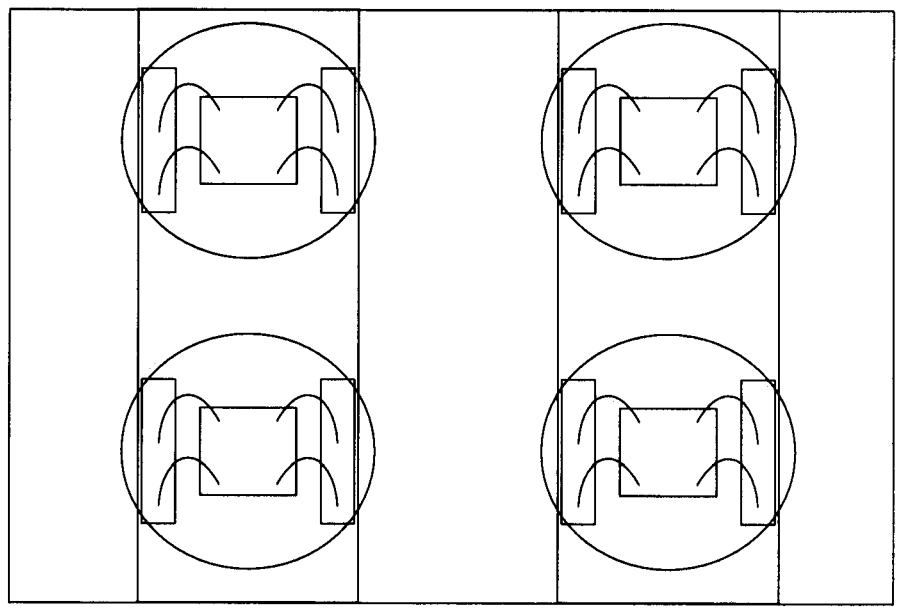
FIG. 21 is an upper surface view of an LED device obtained in Practical Example 13.
Figure 22:
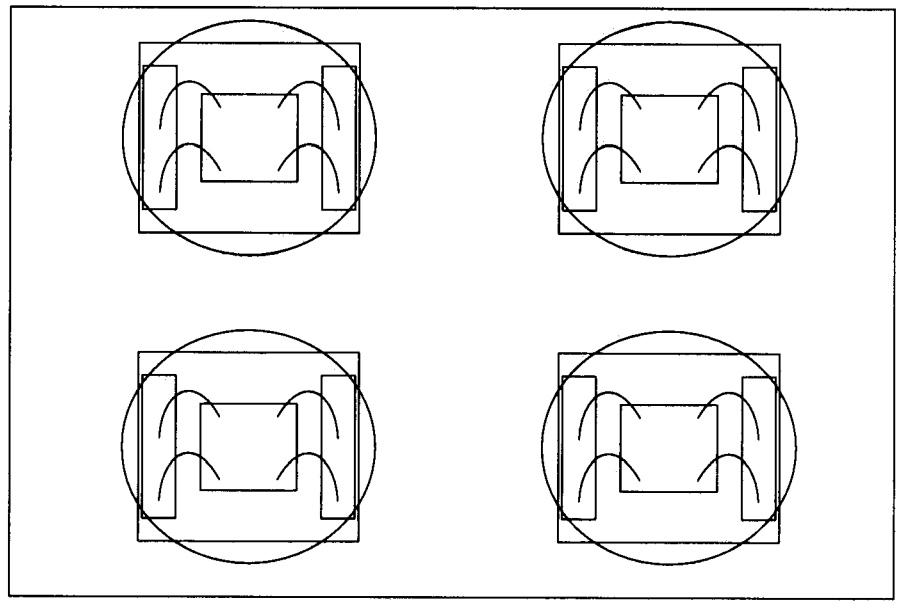
FIG. 22 is an upper surface view of an LED device obtained in Practical Example 13.

The phosphor sheet 2 obtained in working example 7 was partially cut out in a line or square shape to obtain a phosphor sheet 4. The line-shaped (see FIG. 21) or square-shaped (see FIG. 22) phosphor sheet 4 was laminated onto the transparent sheet 1 made in Practical Example 3 to obtain a laminated sheet partially laminated with the phosphor sheet 4. The operations of Practical Example 9 were repeated to obtain an LED device comprising a dome-shaped seal, except that the laminated sheet was supplied to the position corresponding to the cavity so that the phosphor sheet 4 faced the LED (see FIGS. 21 and 22). It was confirmed that the partially laminated phosphor sheet 4 was covered by a dome-shaped transparent seal derived from the transparent sheet 1. Optical microscope observation of the cross section of the seal did not reveal any mixing of phosphor between the transparent seal and the phosphor sheet 4.

Practical Example 14

The liquid hydrosilylation curable silicone composition 2 obtained in Practical Example 2 was pressed in a hot press at 110° C. for 15 minutes to obtain a 1 mm-thick transparent sheet 3. The obtained transparent sheet 3 was placed in a vacuum heating laminator along with an LED retainer board electrically connected via wire bonding. Next, vacuum degassing was performed at 130° C. for one minute, heating was performed at atmospheric pressure for 5 minutes, the sheet was melted and cured to seal the LED, and further heating was performed at 150° C. for one hour to obtain a LED device comprising a seal having a flattened shape.

Practical Example 15

A yellow YAG phosphor (NYAG4454, Intematix) was mixed with the liquid hydrosilylation curable silicone composition 2 prepared in Practical Example 2 to a concentration of 50 mass % with respect to the total mass of the composition to obtain a yellow phosphor-containing liquid silicone composition. The yellow phosphor-containing liquid silicone composition so obtained was heated in a hot press at 120° C. for 15 minutes to obtain a 60 μm-thick phosphor sheet 5. The 1 mm-thick transparent sheet 3 obtained in Practical Example 14 and phosphor sheet 5 were then bonded to form a laminated sheet 4. The obtained laminated sheet 4 was placed in a vacuum heating laminator along with an LED retainer board electrically connected via wire bonding. Next, vacuum degassing was performed at 130° C. for one minute, heating was performed at atmospheric pressure for 5 minutes, the sheet was melted and cured to seal the LED, and further heating was performed at 150° C. for one hour to obtain a LED device comprising a seal having a flattened shape.

Reference Example 1

Synthesis of Wet Hydrophobized Reinforcing Silica

First, 277 g of octamethylcyclotetrasiloxane, 4.6 g of 1,3,5,7-tetramethyl-1,3,5,7-tetravinylcyclotetrasiloxane, 517 g of methyltrimethoxysilane, and 0.43 g of potassium hydroxide serving as a catalyst were reacted for approximately 2 hours at a temperature of 105° C. to produce a hydrophobizing agent comprising a ring-opened and rearranged organopolysiloxane. The potassium hydroxide was neutralized with carbonic acid gas. When the obtained organopolysiloxane was analyzed, it was observed that the substance is a straight-chain organopolysiloxane comprising 0.7 mol % methylvinylsiloxane groups.

Next, the hydrophobizing agent obtained as described above was used to synthesize wet method hydrophobized reinforcing silica as follows. Specifically, 118 g methanol, 32 g concentrated ammonium solution, and 39 g of the hydrophobizing agent obtained above were loaded into a glass reaction container and mixed uniformly with an electromagnetic mixer. Next, 96 g of methyl orthosilicate was added at once to the mixture while the mixture was stirred vigorously. The reaction product became gelatinous after 15 seconds, and stirring was discontinued. The product was left to stand in this state under a hermetic seal at room temperature for one week to age and a liquid dispersion of wet hydrophobized reinforcing silica was obtained. The methanol and ammonia gas were removed from the liquid silica dispersion to produce wet method hydrophobized reinforcing silica. The BET method specific surface area of this wet hydrophobized reinforcing silica was 540 $m^2/g$.

Reference Example 2

Preparation of a Film-Like Thermosetting Silicone Sealing Material

First, 100 parts by mass of a dimethylsiloxane-methylvinylsiloxane copolymer raw rubber comprising 99.63 mol % of a dimethylsiloxane unit and 0.37 mol % of a methylvinylsiloxane unit and having molecular terminals chain capped with dimethylvinylsiloxy groups (degree of polymerization: 4,000) and 75 parts by mass of the wet hydrophobized reinforcing silica produced above with a BET method specific surface area of 540 m²/g were loaded into a kneader mixer and kneaded for 60 minutes at 180° C. After being cooled, 3.0 parts by mass of a methylhydrogenpolysiloxane having molecular terminals chain capped with trimethylsiloxy groups (silicon-bonded hydrogen atom content: 1.5% by mass) with a viscosity of 7 mPa·s at 25° C. and a complex of a chloroplatinic acid and 1,3-divinyltetramethyldisiloxane were mixed into the obtained silicone rubber base so that the amount of platinum metal was 10 ppm, and a transparent thermosetting silicone rubber composition was obtained. The composition was passed through calender rollers to obtain a 1 mm-thick transparent sheet 4.

Practical Example 16

The transparent sheet 4 was further compressed to a thickness of 300 μm using a press to obtain a transparent sheet 5. The transparent sheet 5 had a refractive index at 25° C. of 1.41. Next, the transparent sheet 5 was laminated onto the transparent sheet 3, thereby obtaining a laminated sheet 5. The transparent sheet 3 had a refractive index at 25° C. of 1.55.

The obtained laminated sheet 5 was then set, along with an LED retainer board electrically connected via wire bonding, at a position on a compression molding device provided with a mold having a dome-shaped cavity corresponding to the cavity. The laminated sheet 5 was set so that the transparent sheet 3 having a high refractive index faced the LED, and the transparent sheet 5 having a low refractive index faced the side opposite the LED. Next, compression molding was performed at 130° C. for five minutes, the sheet was melted and cured to seal the LED, and heating was further performed at 150° C. for one hour, thus obtaining an LED device comprising a dome-shaped seal.

Practical Example 17

The type-A hardness of the transparent sheet 4 and transparent sheet 5 after being cured at 150° C. for one hour was A70. Meanwhile, the Shore D hardness of the transparent sheet 3 after being cured at 150° C. for one hour was D74.

Dyneon™ TF Micropowder TF9205 (average particle size 8 μm) from Sumitomo 3M was sprinkled on the transparent sheet 3 and transparent sheet 4 after having been cured at 150° C. for one hour. Next, excess powder attached to the silicone cured product was blown away by air, and residual powder adhesion was observed via optical microscope. As a result, no powder was observed adhering to the surface of the transparent sheet 3, confirming that surface tack was low. Powder was observed adhering to the surface of the transparent sheet 4, confirming that surface tack was high.

The laminated sheet 5 was set, along with an LED retainer board electrically connected via wire bonding, at a position on a compression molding device provided with a mold having a dome-shaped cavity corresponding to the cavity. The laminated sheet 5 was set so that the transparent sheet 5 having low hardness and high surface tack after curing faced the LED, and the transparent sheet 3 having high hardness and low surface tack after curing faced the side opposite the LED. Next, compression molding was performed at 130° C. for five minutes, the sheet was melted and cured to seal the LED, and heating was further performed at 150° C. for one hour, thus obtaining an LED device comprising a dome-shaped seal.

Practical Example 18

20 parts by mass of titanium oxide particles and 50 parts by mass of crushed silica particles were mixed into 30 parts by mass of the hydrosilylation curable silicone composition 2 prepared in Practical Example 2 to obtain a white silicone composition 1. The obtained white silicone composition 1 was heated using a 60 μm thick mold at 120° C. for 15 minutes to obtain a 60 μm-thick white sheet 1. A round hole was punched in the obtained white sheet, which was laminated onto the transparent sheet 3 prepared in Practical Example 14 to obtain a laminated sheet 6 comprising a white sheet 1 with a round punched hole.

Figure 23:
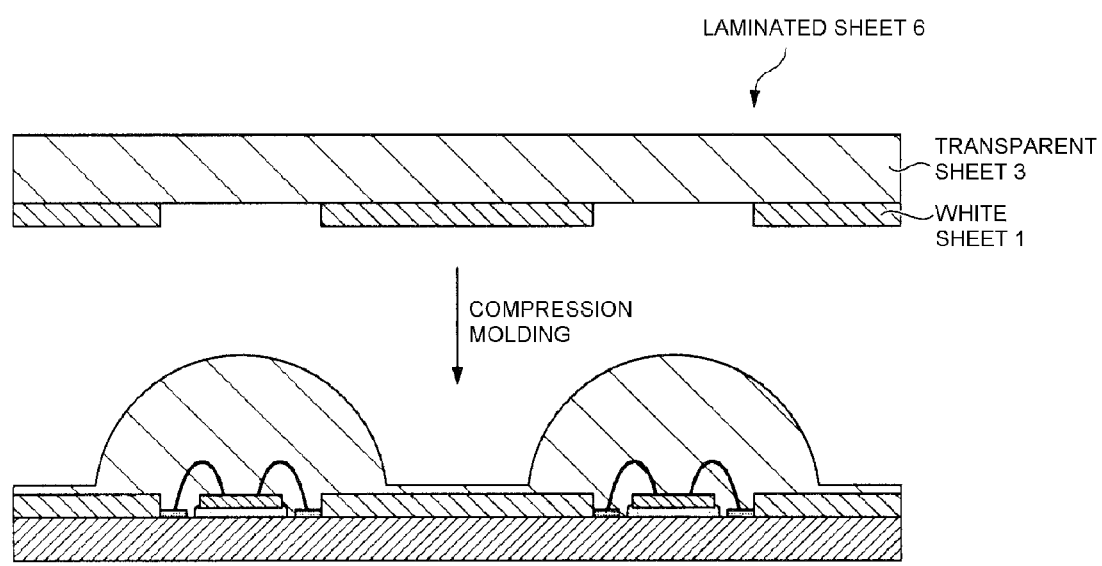
FIG. 23 is a cross-sectional view of an LED device obtained in Practical Example 18.

The obtained laminated sheet 6 was then set, along with an LED retainer board electrically connected via wire bonding, at a position on a compression molding device provided with a mold having a dome-shaped cavity corresponding to the cavity. The laminated sheet 6 was set so that the white sheet 1 contacted the LED retainer board, and the transparent sheet 3 was disposed facing the atmosphere opposite the LED retainer board. Next, compression molding was performed at 130° C. for five minutes, the sheet was melted and cured to seal the LED, and heating was further performed at 150° C. for one hour, thus obtaining an LED device comprising a dome-shaped transparent seal and a white layer having a pattern surrounding the LED, as shown in FIG. 23.

Practical Example 19

A-Stage Material 43 parts by mass of an organopolysiloxane represented by the following average unit formula:

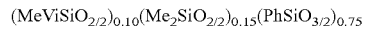

$(MeViSiO_{2/2})_{0.10}(Me_2SiO_{2/2})_{0.15}(PhSiO_{3/2})_{0.75}$ that is solid at 25° C., and 7 parts by mass of an organopolysiloxane represented by the following formula:

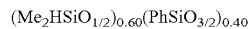

$(Me_2HSiO_{1/2})_{0.60}(PhSiO_{3/2})_{0.40}$ that is liquid at 25° C. were dissolved in 50 parts by mass of toluene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) and 0.001 parts by mass 1,3-bis(diphenylphosphino)propane were added and mixed, after which the toluene was removed using a rotary evaporator at 60° C., thereby preparing a liquid hydrosilylation curable silicone composition 3. The obtained liquid hydrosilylation curable silicone composition 3 was compressed using a 100° C. press to obtain a 1 mm-thick transparent sheet 6.

Practical Example 20

2-Step Methylsilicone Material 35 parts by mass of an organopolysiloxane represented by the following average unit formula:

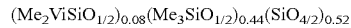

$(Me_2ViSiO_{1/2})_{0.08}(Me_3SiO_{1/2})_{0.44}(SiO_{4/2})_{0.52}$ that is solid at 25° C., 11 parts by mass of an organopolysiloxane represented by the following formula:

$Me_2ViSiO(SiMe_2O)_{80}SiMe_2Vi$ that is liquid at 25° C., and 4 parts by mass of an organopolysiloxane represented by the following formula:

Me$_2$HSiO(SiMe$_2$O)$_{30}$SiMe$_2$H that is liquid at 25° C. were dissolved in 50 parts by mass of xylene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) was added and heated in a flask at 100° C. for 6 hours. No silicon atom-bonded hydrogen atoms were detected via FT-IR, confirming the progress of the hydrosilylation reaction. Four parts by mass of an organopolysiloxane represented by the following average formula:

Me$_3$SiO(SiMeHO)$_{20}$SiMe$_3$ that is liquid at 25° C. and ethynyl hexanol (in an amount equivalent to 1,000 ppm in terms of mass with respect to the total amount of composition) were added to the obtained solution, and the whole was mixed, after which the xylene was removed using a rotary evaporator at 80° C. to prepare a hydrosilylation curable silicone composition 4. The hydrosilylation curable silicone composition 4 was compressed using a 100° C. press to obtain a 1 mm-thick transparent sheet 7.

Practical Example 21

2-Step Phenylsilicone Material 43 parts by mass of an organopolysiloxane represented by the following average unit formula:

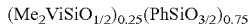
(Me$_2$ViSiO$_{1/2}$)$_{0.25}$(PhSiO$_{3/2}$)$_{0.75}$ that is solid at 25° C. and 7 parts by mass of 1,1,5,5-hexamethyl-3,3-diphenyltrisiloxane that is liquid at 25° C. were dissolved in 50 parts by mass of toluene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) was added and heated in a flask at 100° C. for 6 hours. No silicon atom-bonded hydrogen atoms were detected via FT-IR, confirming the progress of the hydrosilylation reaction. Six parts by mass of an organopolysiloxane represented by the following average unit formula:

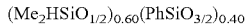
(Me$_2$HSiO$_{1/2}$)$_{0.60}$(PhSiO$_{3/2}$)$_{0.40}$ that is liquid at 25° C. and ethynyl hexanol (in an amount equivalent to 1,000 ppm in terms of mass with respect to the total amount of composition) were added to the obtained solution, and the whole was mixed, after which the toluene was removed using a rotary evaporator at 80° C. to prepare a hydrosilylation curable silicone composition 5. The hydrosilylation curable silicone composition 5 was compressed using a 100° C. press to obtain a 1 mm-thick transparent sheet 8.

Practical Example 22

The transparent sheet 6 prepared in Practical Example 19 and a 1 mm-thick transparent sheet 4 were bonded at room temperature via roller lamination to obtain a laminated sheet 7. The obtained laminated sheet 7 was placed in a roller heating laminator along with an LED retainer board electrically connected via wire bonding. Next, the sheet was laminated, while being melted and thermally compressed at 100° C., to seal the laminated sheet 7 upon the LED retainer board. During the lamination treatment, the transparent sheet 6 was arrayed so as to face the LED. After lamination, the LED retainer board with the laminated sheet 7 compression-bonded thereto was placed in a compression molding device provided with a mold having a dome-shaped cavity. Next, compression molding was performed at 25° C. for 30 seconds to cause pressure deformation, forming a dome shape, and heating was further performed at 150° C. for one hour to obtain an LED device comprising a dome-shaped seal.

Practical Example 23

The transparent sheet 7 prepared in Practical Example 20 and a 1 mm-thick transparent sheet 4 were bonded at room temperature via roller lamination to obtain a laminated sheet 8. The obtained laminated sheet 8 was placed in a roller heating laminator along with an LED retainer board electrically connected via wire bonding. Next, the sheet was laminated, while being melted and thermally compressed at 100° C., to seal the laminated sheet 8 upon the LED retainer board. During the lamination treatment, the transparent sheet 7 was arrayed so as to face the LED. After lamination, the LED retainer board with the laminated sheet 8 compression-bonded thereto was placed in a compression molding device provided with a mold having a dome-shaped cavity. Next, compression molding was performed at 25° C. for 30 seconds to cause pressure deformation, forming a dome shape, and heating was further performed at 150° C. for one hour to obtain an LED device comprising a dome-shaped seal.

Practical Example 24

The transparent sheet 8 prepared in Practical Example 21 and a transparent sheet 3 were bonded at room temperature via roller lamination to obtain a laminated sheet 9. The obtained laminated sheet 9 was set, along with an LED retainer board electrically connected via wire bonding, at a position on a compression molding device provided with a mold having a dome-shaped cavity corresponding to the cavity. The laminated sheet 9 was set so that the transparent sheet 3 faced the LED and the transparent sheet 7 faced a side opposite the LED. Next, compression molding was performed at 130° C. for five minutes, the sheet was melted and cured to seal the LED, and heating was further performed at 150° C. for one hour, thus obtaining an LED device comprising a dome-shaped seal.

Practical Example 25

The laminated sheet 4 prepared in Practical Example 15 was set in a vacuum heating laminator along with an LED retainer board electrically connected via wire bonding. A release film was further set upon the laminated sheet 4, and a patterned aluminum plate was further placed upon the release film. Next, vacuum degassing was performed at 150° C. for one minute, heating was performed atmospheric pressure for 5 minutes, the sheet was melted and cured to seal the LED, and further heating was performed at 150° C. for one hour to obtain a LED device comprising a seal having a pattern at the interface thereof with the air.

REFERENCE NUMERALS

1 Supporter sheet
2 First single-layer sheet (transparent layer) (seal)

3 Inorganic particles and/or phosphor
4 Second single-layer sheet (fluorescent layer)
5 Single-layer sheet
6 Single-layer sheet
7 Different fluorescent layer
8 Substrate
9 LED chip
10 Wire
11 Mold

The invention claimed is:

1. A laminate including at least one layer comprising a hot-melt type curable silicone composition selected from the group consisting of:
   (1) an unreacted hydrosilylation curable silicone composition;
   (2) a hydrosilylation curable silicone composition obtained by partially cross-linking an unreacted hydrosilylation curable silicone composition; and
   (3) a hydrosilylation curable silicone composition comprising: a crosslinked product having silicon atom-bonded hydrogen atoms and/or alkenyl groups; and at least one type of hydrosilylation reactive component, the crosslinked product being obtained by cross-linking an unreacted hydrosilylation reactive silicone composition; and
   wherein the laminate comprises at least one layer comprising at least one type of non-hot melt curable silicone composition or at least one type of organopolysiloxane block copolymer.

2. The laminate according to claim 1, wherein the organopolysiloxane block copolymer comprises:
   from 40 to 90 mol % of a disiloxy unit represented by $[R^6{}_2SiO_{2/2}]$;
   from 10 to 60 mol % of a trisiloxy unit represented by $[R^7SiO_{3/2}]$; and
   from 0.5 to 2.5 mol % of a silanol group represented by $[\equiv SiOH]$;
   each $R^6$ independently representing a $C_1$-$C_{30}$ hydrocarbon group;
   each $R^7$ independently representing a $C_1$-$C_{20}$ hydrocarbon group;
   the disiloxy unit $[R^6{}_2SiO_{2/2}]$ being present in a straight chain block comprising an average of from 10 to 400 disiloxy units $[R^6{}_2SiO_{2/2}]$;
   the trisiloxy unit being present in a non-straight chain block having a molecular weight of at least 500 g/mol; and
   each straight chain block being bonded to at least one non-straight chain block.

3. The laminate according to claim 2, wherein the organopolysiloxane block copolymer has a molecular weight of at least 20,000 g/mol or a refractive index of at least 1.5.

4. The laminate according to claim 1, wherein each of the layers differs from each other in terms of at least one physical property selected from the group consisting of refractive index, hardness, light transmission rate, water vapor transmission rate, thermal conductivity, thermal expansion, surface tack, elastic modulus, and curing rate.

5. The laminate according to claim 1, wherein the hardness and/or refractive index of at least one layer varies in the through-thickness direction of the layer.

6. The laminate according to claim 1, wherein at least one layer has a patterned shape.

7. The laminate according to claim 1, wherein at least one layer comprises at least one type of inorganic particle or a phosphor.

8. The laminate according to claim 1, further includes at least two layers comprising different types of phosphors.

9. A method of manufacturing a sealed semiconductor device comprising laying the laminate of claim 1 over an element of the semiconductor device and encapsulating the element by performing compression molding or laminating of the sheet onto the element.

10. A sealed semiconductor device produced according to the method of claim 9.

* * * * *